United States Patent
Mori et al.

(10) Patent No.: US 12,422,184 B2
(45) Date of Patent: Sep. 23, 2025

(54) REFRIGERATOR

(71) Applicant: Panasonic Intellectual Property Management Co., Ltd., Osaka (JP)

(72) Inventors: Kiyoshi Mori, Shiga (JP); Kei Nambu, Kyoto (JP); Tsuyoki Hirai, Shiga (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 929 days.

(21) Appl. No.: 17/626,081

(22) PCT Filed: Sep. 24, 2020

(86) PCT No.: PCT/JP2020/036010
§ 371 (c)(1),
(2) Date: Jan. 10, 2022

(87) PCT Pub. No.: WO2021/070620
PCT Pub. Date: Apr. 15, 2021

(65) Prior Publication Data
US 2022/0252339 A1 Aug. 11, 2022

(30) Foreign Application Priority Data
Oct. 9, 2019 (JP) .................. 2019-186147

(51) Int. Cl.
*H05B 6/54* (2006.01)
*F25D 31/00* (2006.01)
(Continued)

(52) U.S. Cl.
CPC .......... *F25D 31/005* (2013.01); *H05B 6/50* (2013.01); *H02M 3/33569* (2013.01)

(58) Field of Classification Search
CPC .. H02M 1/009; H02M 3/335; H02M 3/33507; H02M 3/33561; H02M 3/33569;
(Continued)

(56) References Cited

U.S. PATENT DOCUMENTS

2004/0070376 A1* 4/2004 Hoshino ............ H02M 3/158
　　　　　　　　　　　　　　　　　　　　　323/267
2010/0172159 A1* 7/2010 Kyono ............ H02M 3/33507
　　　　　　　　　　　　　　　　　　　　　363/21.17
(Continued)

FOREIGN PATENT DOCUMENTS

CN　　109892009 A　　6/2019
JP　　53-153558 U　　12/1978
(Continued)

OTHER PUBLICATIONS

Rectifier Definition, 2008, https://www.mehttps://www.merriam-webster.com/dictionary/rectifier, p. 1 (Year: 2008).*

(Continued)

*Primary Examiner* — Tiffany T Tran
(74) *Attorney, Agent, or Firm* — HSML P.C.

(57) ABSTRACT

Provided is a refrigerator that includes a storage chamber capable of storing a preserved product, power supply unit (48), oscillation circuit (22), oscillation electrode (24) and counter electrode (25), matching unit (52) that matches impedance, controller (50), and a shield. Power supply unit (48) includes a first power supply part that rectifies an alternating current from a commercial alternating-current power supply and converts the alternating current into a direct current, a first ground part that serves as a reference potential of the first power supply part, a second power supply part and a third power supply part that each step down an output voltage of the first power supply part and output the stepped-down output voltage, a second ground part that serves as a reference potential of the second power supply part, and a third ground part that serves as a reference potential of the third power supply part. Oscillation circuit (22) is supplied with power from the second power supply part, and controller (50) is supplied with power from the third power supply part.

4 Claims, 14 Drawing Sheets

(51) Int. Cl.
*H05B 6/50* (2006.01)
*H02M 3/335* (2006.01)

(58) Field of Classification Search
CPC .... H02M 3/33523; H02M 7/04; H02M 7/217;
F25D 31/005; F25D 23/12; F25D 11/02;
H05B 6/50; H05B 6/62; H05B 6/54;
A23B 2/80; H05K 9/00
See application file for complete search history.

(56) References Cited

U.S. PATENT DOCUMENTS

2019/0230752 A1     7/2019   Tomomura et al.
2020/0109892 A1*   4/2020   Zhu ........................ H05B 6/688

FOREIGN PATENT DOCUMENTS

| JP | H08327201 A * | 6/1995 |
| JP | 9-166942 | 6/1997 |
| JP | 2002-147919 | 5/2002 |
| JP | 2009-134945 | 6/2009 |
| WO | 2018/078898 | 5/2018 |

OTHER PUBLICATIONS

English Translation of Chinese Search Report dated Feb. 9, 2023 for the related Chinese Patent Application No. 202080065616.0, 2 pages.
International Search Report issued in International Application No. PCT/JP2020/036010, Nov. 24, 2020, 6 pages w/translation.

\* cited by examiner

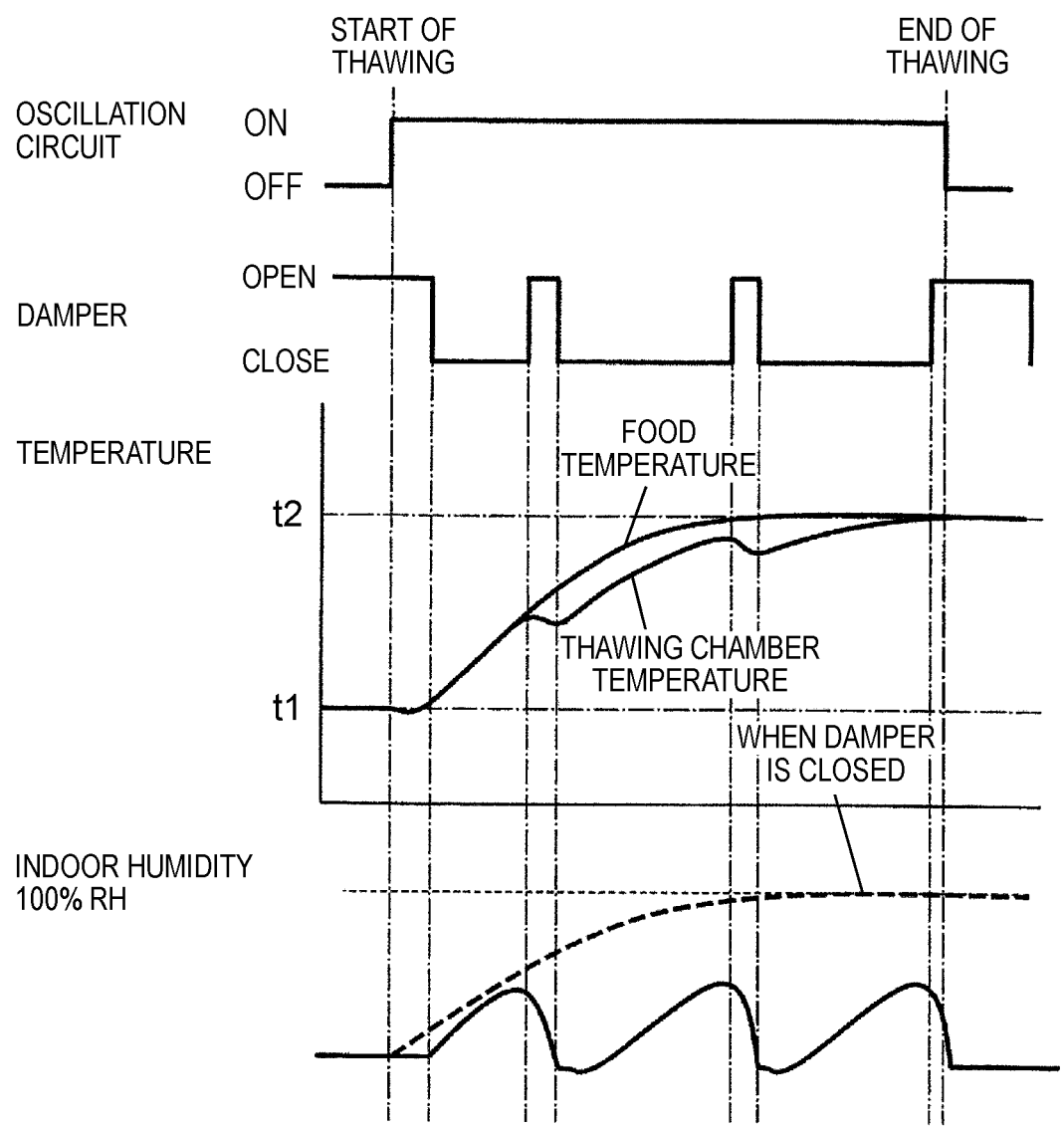

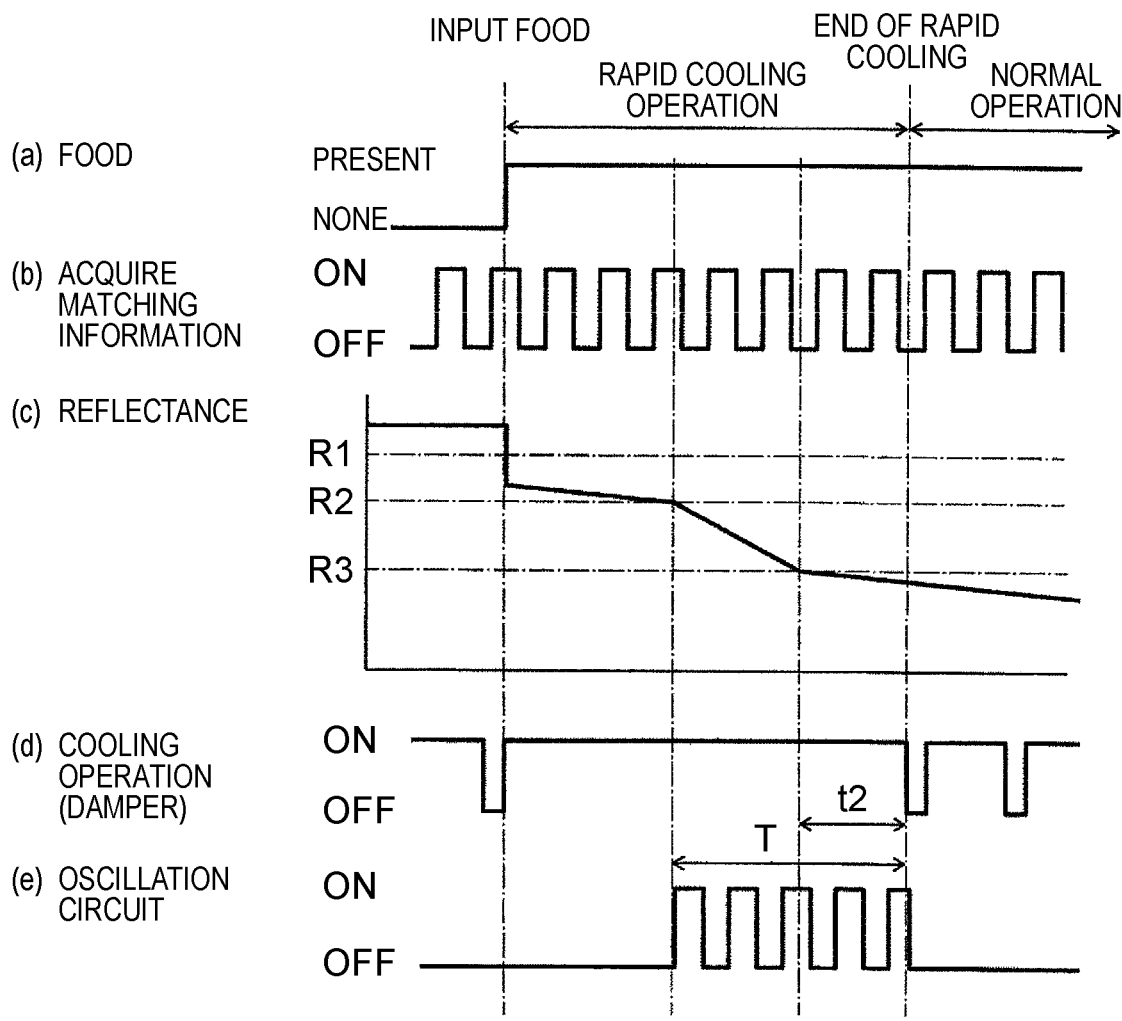

REFRIGERATOR

TECHNICAL FIELD

The present disclosure relates to a refrigerator having a freezing function and including a storage chamber capable of thawing a frozen product.

BACKGROUND ART

PTL 1 discloses a conventional refrigerator including a storage chamber capable of thawing a frozen product. The refrigerator includes a freezer unit including a freezer and a magnetron for high frequency generation. The freezer unit is provided inside with a high-frequency heating chamber (storage chamber) capable of thawing a frozen product together with a freezing chamber. The freezer unit is configured not only to supply cold air to the high-frequency heating chamber from the freezer through a cold air circulation duct, but also to emit high-frequency waves to the high-frequency heating chamber from the magnetron to thaw a frozen product.

CITATION LIST

Patent Literature

PTL 1: Unexamined Japanese Patent Publication No. 2002-147919

SUMMARY OF THE INVENTION

The present disclosure provides a refrigerator improved in reliability for cooling and thawing, and in safety while enabling a preserved product accommodated in a storage chamber capable of thawing a frozen product to be frozen, stored, and thawed in a desired state.

A refrigerator according to the present disclosure includes the following:

- a storage chamber having a space to store a preserved product;
- a power supply unit;
- an oscillator that is supplied with power from the power supply unit and forms high frequency power;
- an oscillation electrode and a counter electrode disposed facing each other and connected to the oscillator, the oscillation electrode and the counter electrode receiving the high frequency power from the oscillator to generate a high-frequency electric field in the storage chamber;
- a matching unit that matches an output impedance of the oscillator to a load impedance of a device including the oscillation electrode and the counter electrode;
- a controller configured to control application of the high-frequency electric field between the oscillation electrode and the counter electrode; and
- a shield that prevents leakage of an electromagnetic wave due to generation of the high frequency power,
- the power supply unit including:
- a first power supply part that rectifies an alternating current from a commercial alternating-current power supply and converts the alternating current into a direct current;
- a first ground part having a reference potential of the first power supply part;
- a second power supply part and a third power supply part that step down an output voltage of the first power supply part and output the stepped-down output voltage;
- a second ground part having a reference potential of the second power supply part;
- a third ground part having a reference potential of the third power supply part;
- the oscillator being supplied with power from the second power supply part, and
- the controller being supplied with power from the third power supply part.

BRIEF DESCRIPTION OF DRAWINGS

FIG. 14 is a graph showing not only waveforms of control signals of an oscillation circuit and a damper in thawing treatment, but also a food temperature, a room temperature in the freezing-thawing chamber, and a humidity in the freezing-thawing chamber, during the thawing treatment, in a configuration of the first exemplary embodiment.

FIG. 17 is a waveform chart showing a state of each element during rapid cooling operation in the configuration of the first exemplary embodiment.

Figure 1:
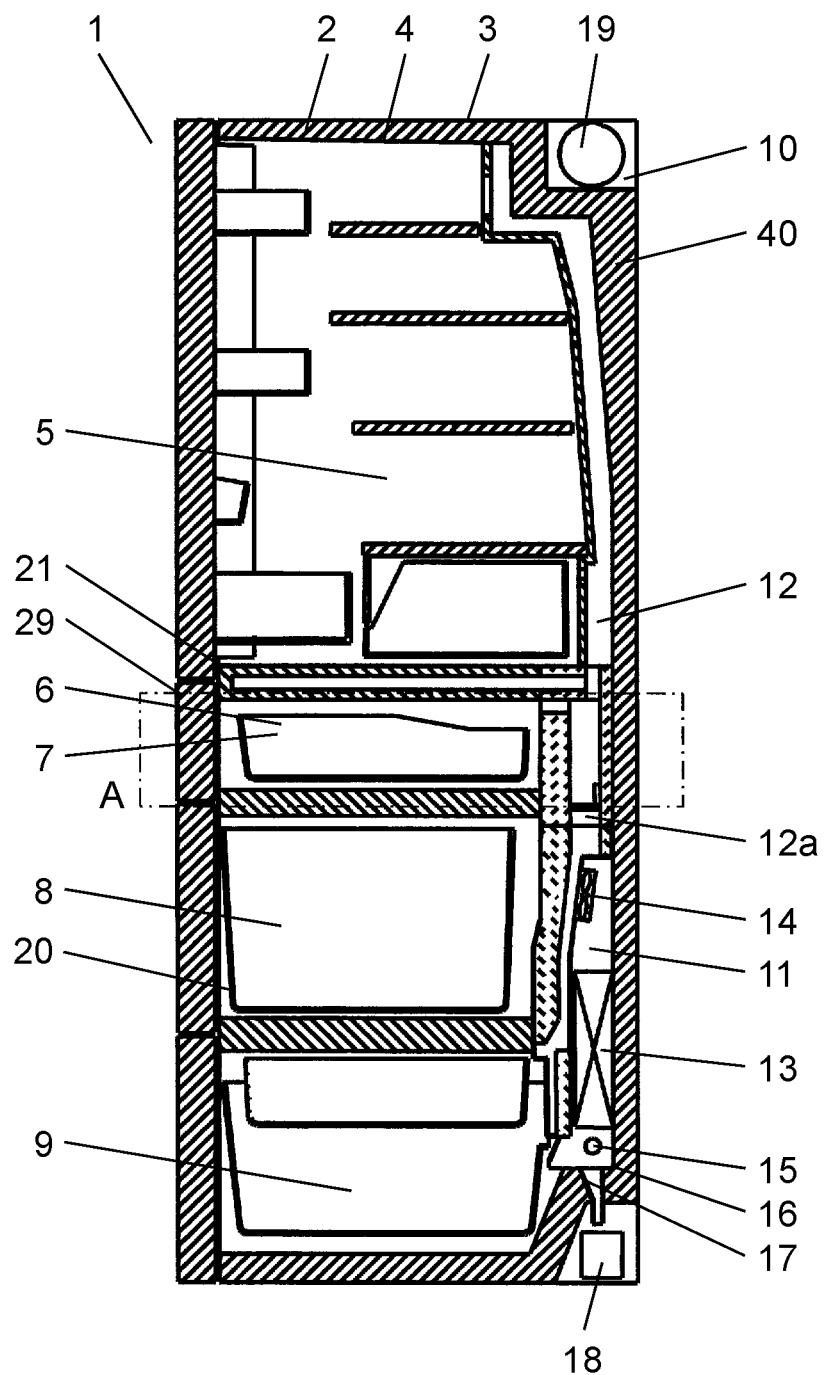
FIG. 1 is a longitudinal sectional view of a refrigerator according to a first exemplary embodiment.

DESCRIPTION OF EMBODIMENT (Knowledge and the Like Underlying the Present Disclosure)

At the time when the inventors conceived of the present disclosure, a refrigerator described in PTL 1 was known. This refrigerator is configured to irradiate a frozen product in a high-frequency heating chamber with high-frequency waves from a magnetron via an antenna or the like to perform high-frequency heating. For this reason, it is difficult to uniformly heat and thaw the frozen product into a desired state. The frozen product is irradiated with high frequency waves from the magnetron and heated with high frequency waves. This requires providing a magnetron and a cooling mechanism thereof that are each relatively large as a component, so that downsizing is difficult. A configuration in which a high frequency heater is provided in a refrigerator to perform thawing treatment needs to prevent high frequency waves from the high frequency heating device from adversely affecting a preserved food in another storage chamber and a user who handles the refrigerator. This requires functions (cooling function, storage function) as a refrigerator to be reliably secured and a configuration with high safety, and thus resulting in a problem.

In view of these problems, the inventors of the present disclosure have made the subject matter of the present disclosure to solve the problems.

The present disclosure provides a refrigerator having a highly reliable cooling function and storage function, i.e., a refrigerator capable of freezing, storing, and thawing a preserved product accommodated in a storage chamber in a desired state. At the same time, downsizing and high safety of devices are achieved.

With reference to the accompanying drawings, a refrigerator having a freezing function will be described below as an exemplary embodiment of a refrigerator of the present disclosure. The refrigerator of the present disclosure is not limited to the configuration of the refrigerator described in the following exemplary embodiment. Thus, the refrigerator is applicable to a freezer having only a freezing function, and includes various refrigerators and freezers having technical features described in the following exemplary embodiment. Thus, the refrigerator in the present disclosure includes a refrigerating chamber and/or a freezing chamber.

Numerical values, shapes, configurations, steps, and order of the steps, for example, illustrated in the following exemplary embodiment are merely examples, and thus are not intended to limit the present disclosure. Components in the following exemplary embodiment includes a component that is not described in an independent claim representing the most superordinate concept, the component being described as an optional component. In the exemplary embodiment, the same elements are denoted by the same reference numerals also in a modification, and duplicated description thereof may be eliminated. For easy understanding, the drawings illustrate mainly components schematically.

First Exemplary Embodiment

Hereinafter, a refrigerator according to a first exemplary embodiment of the present disclosure will be described with reference to the drawings. For easy understanding, the present disclosure will be described for each item.

[1-1. General Configuration of Refrigerator]

FIG. 1 illustrates a longitudinal sectional of refrigerator 1 according to the present exemplary embodiment.

In FIG. 1, a left side is a front side of refrigerator 1, and a right side is a back side of refrigerator 1. Refrigerator 1 includes heat-insulating box 2 formed of outer box 3 mainly made of a steel plate, inner box 4 molded of resin such as acrylonitrile-butadiene-styrene (ABS) resin, and heat insulator 40 (e.g., hard urethane foam) filled and foamed in a space between outer box 3 and inner box 4.

Heat-insulating box 2 of refrigerator 1 includes a plurality of storage chambers, and openable doors are provided at front side openings of the respective storage chambers. Each of the storage chambers is sealed by closing the door to prevent cold air from leaking. Refrigerator 1 of the first exemplary embodiment has an uppermost storage chamber serving as refrigerating chamber 5. Two storage chambers, i.e., ice-making chamber 7 and freezing-thawing chamber 6, are provided side by side on both sides immediately below refrigerating chamber 5. Freezing chamber 8 is provided immediately below ice-making chamber 7 and freezing-thawing chamber 6, and vegetable chamber 9 is provided in a lowermost portion immediately below freezing chamber 8. Although each of the storage chambers in refrigerator 1 of the first exemplary embodiment has the above configuration, this configuration is an example, and a placement configuration of each of the storage chambers can be appropriately changed at the time of design according to specifications and the like.

Refrigerating chamber 5 is maintained at a non-freezing temperature, specifically, within a temperature range from 1° C. to 5° C. to refrigerate and store a preserved product such as food. Vegetable chamber 9 is maintained within a temperature range equivalent to or slightly higher than a temperature range of refrigerating chamber 5, for example, within a range from 2° C. to 7° C. Freezing chamber 8 is set to a freezing temperature range for frozen storage, specifically, for example, a range from −22° C. to −15° C. Freezing-thawing chamber 6 is typically maintained in the same freezing temperature range as freezing chamber 8, and thawing treatment for thawing a preserved product (frozen product) accommodated is performed in response to a thawing command from a user. Details on a configuration of freezing-thawing chamber 6 and the thawing treatment will be described later.

Machine chamber 10 is provided at an upper part of refrigerator 1. Machine chamber 10 accommodates compressor 19 and components constituting a refrigeration cycle such as a dryer for removing moisture in the refrigeration cycle. A placement position of machine chamber 10 is not specified in the upper part of refrigerator 1, and thus is appropriately determined according to a placement position of the refrigeration cycle or the like. Thus, machine chamber 10 may be disposed in another region such as a lower part of refrigerator 1.

Cooling chamber 11 is provided behind freezing chamber 8 and vegetable chamber 9 in a lower region of refrigerator 1. Cooling chamber 11 is provided with cooler 13 that is a component of the refrigeration cycle that generates cold air, and cooling fan 14 that blows cold air generated by cooler 13 to the respective storage chambers (refrigerating chamber 5, freezing-thawing chamber 6, ice-making chamber 7, freezing chamber 8, and vegetable chamber 9). Cooler 13 generates cold air and cooling fan 14 causes the cold air to flow through air passage 12 connected to the respective storage chambers to supply the cold air to the respective storage chambers. Air passage 12 connected to each storage chamber is provided with damper 12a. Each storage chamber is maintained within a predetermined temperature range under rotation speed control of compressor 19 and cooling fan 14, and opening and closing control of damper 12a. Cooling chamber 11 is provided in its lower portion with defrosting heater 15 that defrosts frost and ice adhering to cooler 13 and its surroundings. Defrosting heater 15 is provided below with drain pan 16, drain tube 17, and evaporating pan 18. The configuration described above enables moisture generated at the time of defrosting or the like to be evaporated.

Refrigerator 1 according to the first exemplary embodiment includes operation unit 47 (see FIG. 9 described later). Operation unit 47 allows a user to issue various commands (e.g., temperature setting of each storage chamber, a rapid cooling command, a thawing command, an ice making stop command, or the like) to refrigerator 1. Operation unit 47 also includes a display that notifies of occurrence of abnormality and the like. Refrigerator 1 may include a wireless communication unit that is connected to a wireless LAN network to input various commands from an external terminal of a user. Refrigerator 1 may include a voice recognition unit to allow a user to input a voice command.

FIGS. 3, 4, 6, and 7 are each a longitudinal sectional view illustrating freezing-thawing chamber 6 in refrigerator 1 according to the first exemplary embodiment. Freezing-thawing chamber 6 is a freezer that holds a preserved product such as food accommodated in freezing-thawing chamber 6 within a freezing temperature range. Freezing-thawing chamber 6 serves as a thawing chamber for performing thawing treatment by dielectric heating when refrigerator 1 receives a thawing command for the preserved product.

Features of each of FIGS. 3, 4, 6, and 7 will be described again in "1-4. Structure of system of dielectric heating mechanism" described later.

Freezing-thawing chamber 6 is maintained in the same freezing temperature range as freezing chamber 8 such that cold air generated in cooler 13 flows through air passages 12 provided behind and above freezing-thawing chamber 6, and is introduced into freezing-thawing chamber 6 through a plurality of cold air introduction holes 20 provided in a top surface of freezing-thawing chamber 6. Air passage 12 communicating with freezing-thawing chamber 6 from cooling chamber 11 is provided with damper 12a. Damper 12a controlled to open and close allows freezing-thawing chamber 6 to be maintained at a predetermined freezing temperature range to freeze and store a preserved product accommodated.

Freezing-thawing chamber 6 has a back surface in which a cold air exhaust hole (not illustrated) is formed. Cold air introduced into freezing-thawing chamber 6 and having cooled the inside of freezing-thawing chamber 6 returns to cooling chamber 11 through a return air passage (not illustrate) from the cold air exhaust hole, and is re-cooled by cooler 13. That is, refrigerator 1 according to the first exemplary embodiment is configured to circulate cold air formed by cooler 13.

Freezing-thawing chamber 6 has a storage space with inner surfaces composed of its top surface, back surface, both side surfaces, and bottom surface that are formed of resin inner surface members 32 (32a to 32c) formed of an electrically insulator. Freezing-thawing chamber 6 has a front opening provided with door 29, and closing door 29 seals the storage space of freezing-thawing chamber 6. Freezing-thawing chamber 6 of the first exemplary embodiment is provided with housing case 31 opened upward behind door 29. Housing case 31 is configured to move back and forth simultaneously by opening and closing operation of door 29 in a front-rear direction. Opening and closing door 29 in the front-rear direction facilitates putting and taking a preserved product such as food in and out of housing case 31.

[1-2. Dielectric Heating Mechanism for Thawing Frozen Product]

Next, a dielectric heating mechanism for performing dielectric heating for performing thawing treatment on a preserved product frozen and stored in freezing-thawing chamber 6 will be described.

Figure 9:
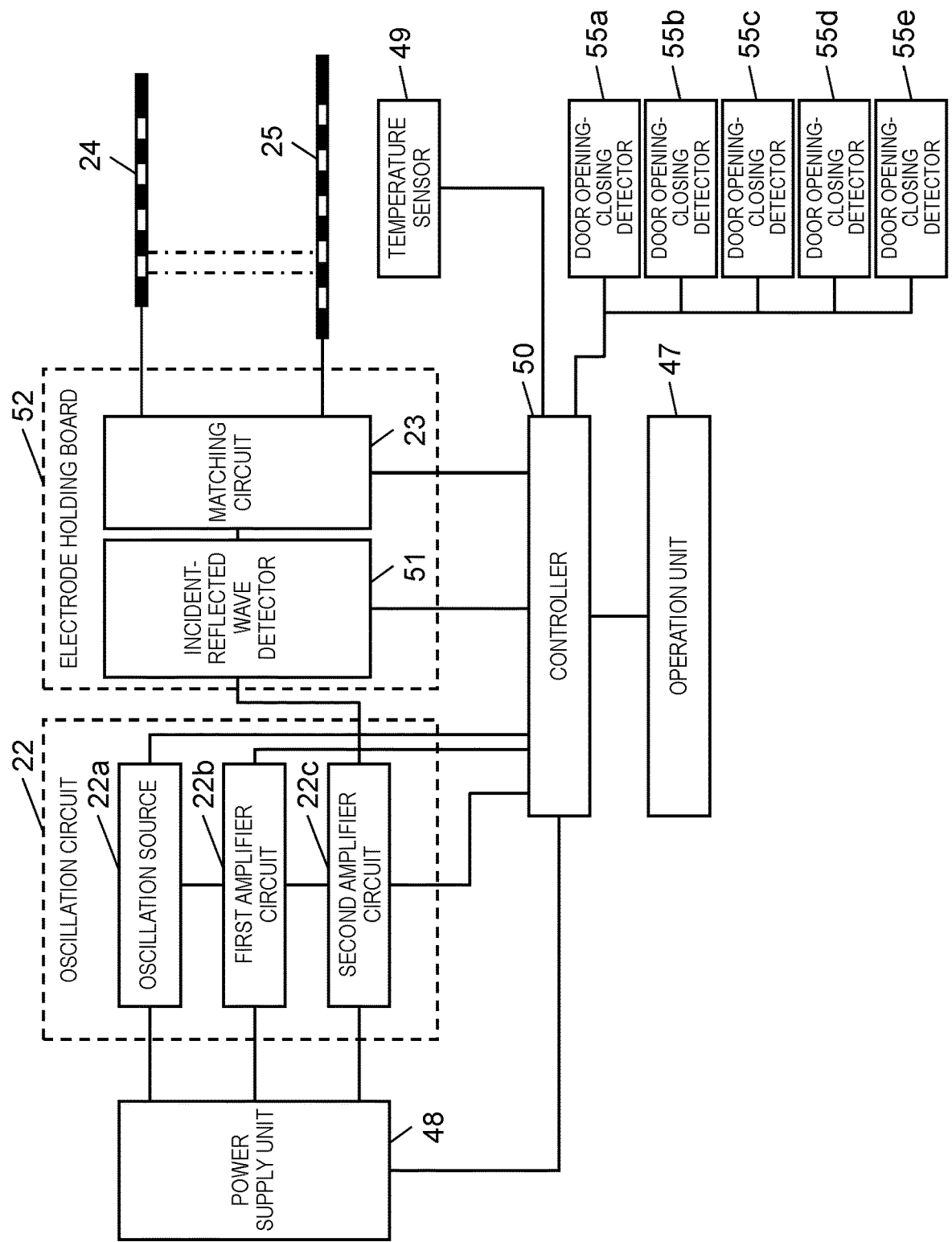
FIG. 9 is a block diagram illustrating a configuration of a dielectric heating mechanism provided in the refrigerator according to the first exemplary embodiment.

FIG. 9 is a block diagram illustrating a configuration of a dielectric heating mechanism provided in refrigerator 1 according to the first exemplary embodiment. The dielectric heating mechanism according to the first exemplary embodiment includes oscillation circuit 22, matching circuit 23, oscillation electrode 24, counter electrode 25, and controller 50. Oscillation circuit 22 receives power from power supply unit 48 to form a predetermined high frequency signal. Oscillation circuit 22 is formed using a semiconductor element and is downsized. As described later, oscillation circuit 22 is formed together with matching circuit 23 on electrode holding board 52 in electrode holding region 30 (see FIGS. 3, 4, 6, and 7) that is a space behind freezing-thawing chamber 6. Oscillation circuit 22 and matching circuit 23 serve as a high frequency power forming unit for forming a high-frequency electric field to be applied between oscillation electrode 24 and counter electrode 25.

Oscillation electrode 24 is an electrode disposed close to the top surface of freezing-thawing chamber 6. Counter electrode 25 is an electrode disposed close to the bottom surface of freezing-thawing chamber 6. Oscillation electrode 24 and counter electrode 25 are disposed to face each other across a storage space (thaw space) of freezing-thawing chamber 6. Oscillation electrode 24 faces counter electrode 25 with a predetermined interval (H in FIG. 8) set using electrode holding board 52 and the like provided as described in "1-3. Configuration of circuit board of dielectric heating mechanism" described later. As a result, the dielectric heating mechanism according to first exemplary embodiment includes oscillation electrode 24 and counter electrode 25 that are disposed substantially parallel to each other. In the present disclosure, although "substantially parallel" indicates a state of being essentially parallel, it includes an error due to a variation in processing accuracy and the like.

Oscillation electrode 24 is provided on one surface in the storage space. Counter electrode 25 is provided on the other surface in the storage space, facing the one surface across the storage space. Matching circuit 23 close to the back surface, oscillation electrode 24 close to the top surface, and counter electrode 25 close to the bottom surface, which constitute the dielectric heating mechanism, are covered with inner surface member 32. This enables a preserved product to be reliably prevented from burning (Joule heating of foodstuffs) due to contact of the preserved product with matching circuit 23, oscillation electrode 24, or counter electrode 25.

The configuration of the first exemplary embodiment will be described in which oscillation electrode 24 is provided on the top surface constituting the storage space of freezing-thawing chamber 6, and counter electrode 25 is provided on the bottom surface in the storage space of freezing-thawing chamber 6. However, the present disclosure is not limited to this configuration. Any configuration in which oscillation electrode 24 and counter electrode 25 face each other across a storage space (thawing space) achieves a similar effect. Examples of the configuration include a configuration in which oscillation electrode 24 and counter electrode 25 are disposed upside down from the present exemplary embodiment, and a configuration in which oscillation electrode 24 and counter electrode 25 face each other horizontally across the storage space.

Oscillation circuit 22 outputs a high-frequency (40.68 MHz in the first exemplary embodiment) voltage in a very high frequency (VHF) band. When oscillation circuit 22 outputs the high-frequency voltage, an electric field is formed between oscillation electrode 24 connected to oscillation circuit 22 and counter electrode 25. As a result, a preserved product being a dielectric disposed in the storage space between oscillation electrode 24 and counter electrode 25 of freezing-thawing chamber 6 is heated by dielectric heating and thawed.

Matching circuit 23 adjusts load impedance formed by oscillation electrode 24, counter electrode 25, and a preserved product accommodated in freezing-thawing chamber 6 such that the load impedance matches output impedance of oscillation circuit 22. Matching circuit 23 matches the impedances to minimize a reflected wave of a high frequency wave output.

The dielectric heating mechanism according to the present exemplary embodiment includes incident-reflected wave detector 51 for detecting an incident wave that is output from oscillation circuit 22 to oscillation electrode 24 and a reflected wave that returns from oscillation electrode 24 to oscillation circuit 22. Oscillation circuit 22 is electrically connected to oscillation electrode 24 through incident-reflected wave detector 51 and matching circuit 23.

Controller 50 calculates a ratio (reflectance) of the reflected wave output to the incident wave output based on the incident wave and the reflected wave detected by incident-reflected wave detector 51, and performs various controls as described later based on the calculation result. The ratio (reflectance) of the reflected wave output to electromagnetic wave output may be calculated based on a set value of high frequency power to be output from the oscillation circuit 22 after impedance is matched in matching circuit 23 and the reflected wave detected by incident-reflected wave detector 51. Each control described later may be performed using only the reflected wave output regardless of the set value of output of the electromagnetic wave or a detection value of the incident wave.

As illustrated in a control block diagram of FIG. 9, the dielectric heating mechanism includes controller 50 that drives and controls oscillation circuit 22 and matching circuit 23 based on signals from operation unit 47 on which a user performs setting operation, temperature sensor 49 that detects an internal temperature, and the like. Controller 50 includes a central processing unit (CPU), and executes a control program stored in a memory such as a read only memory (ROM) to perform various controls.

[1-3. Configuration of Circuit Board of Dielectric Heating Mechanism]

Oscillation circuit 22, incident-reflected wave detector 51, matching circuit 23, and oscillation electrode 24 are connected with a wire on an anode side, the wire desirably having a short length to improve reliability. Thus, in the present exemplary embodiment, electrode holding board 52 (see FIGS. 3, 4, 6, and 7) including these circuits and oscillation electrode 24, and electrode holding board 52 and counter electrode 25 are directly connected without using a lead wire, a coaxial cable, or the like. Electrode holding board 52 is disposed in electrode holding region 30 behind freezing-thawing chamber 6. Electrode holding board 52 includes at least matching circuit 23.

To accurately determine whether impedance matching is sufficiently performed by matching circuit 23, incident-reflected wave detector 51 is provided on electrode holding board 52. Incident-reflected wave detector 51 and matching circuit 23 are desirably combined into one board. This does not require disposing a lead wire or a coaxial cable and connectors for connecting the lead wire or the coaxial cable between matching circuit 23 and incident-reflected wave detector 51. Thus, the circuit board can be also simplified in structure.

FIG. 9 illustrates electrode holding board 52 on which incident-reflected wave detector 51 and matching circuit 23 are disposed. However, all of matching circuit 23, incident-reflected wave detector 51, and oscillation circuit 22 may be provided on one board. This reduces power transmission loss generated by the lead wire or the coaxial cable, and the impedance matching can be improved in accuracy.

Each of the above circuits, e.g., oscillation circuit 22 and matching circuit 23 may be provided separately and electrically connected with a lead wire or a coaxial cable. Such a case enables achieving a reasonable placement configuration using an empty space in the refrigerator, such as installing oscillation circuit 22 using machine chamber 10 having a large empty space, for example.

[1-4. Structure of System of Dielectric Heating Mechanism]

The dielectric heating mechanism according to the first exemplary embodiment configured as described above includes oscillation electrode 24 and counter electrode 25 that face each other substantially parallel to each other. Thus, an electric field is made uniform in the thawing space being the storage space of freezing-thawing chamber 6. To dispose oscillation electrode 24 and counter electrode 25 substantially parallel to each other with a predetermined interval (H in FIG. 8), the dielectric heating mechanism according to the first exemplary embodiment maintains the interval between the electrodes as described below.

Figure 8:
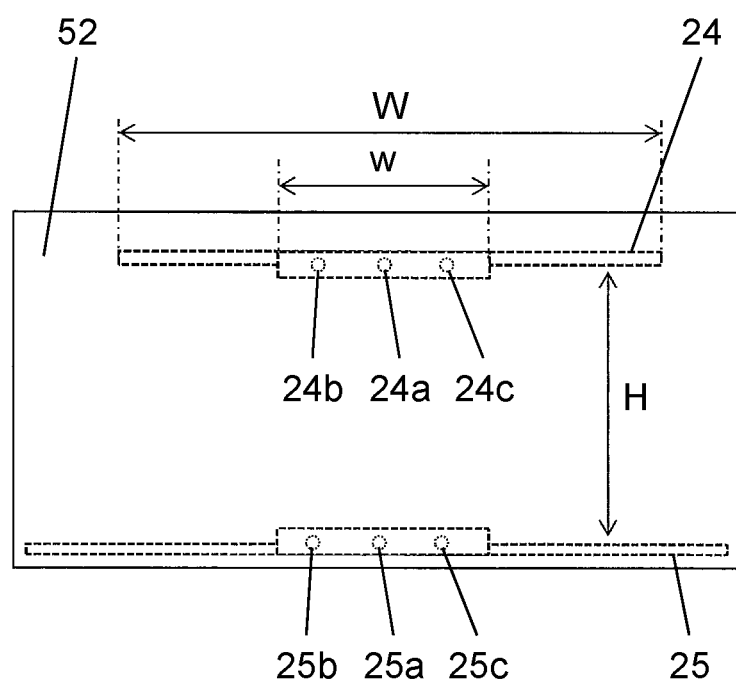
FIG. 8 illustrates an electrode holding region on a back side of the freezing-thawing chamber according to the first exemplary embodiment.

FIG. 8 illustrates electrode holding region 30 behind freezing-thawing chamber 6 in the first exemplary embodiment, and illustrates an electrode holding mechanism in electrode holding region 30. FIG. 8 illustrates electrode holding region 30 as viewed from behind, in which oscillation electrode 24 is disposed on an upper side (top surface side), and counter electrode 25 is disposed on a lower side (bottom surface side). Oscillation electrode 24 is provided on its end close to the back surface with anode terminals 24a, 24b, 24c that protrude. Anode terminals 24a to 24c are bent to protrude upward (toward the top surface) or downward (toward the bottom surface) at a right angle from an end of oscillation electrode 24 close to the back surface. Similarly, counter electrode 25 is provided in its central portion close the back surface with cathode terminals 25a, 25b, 25c that protrude. Cathode terminals 25a to 25c are bent to protrude upward (toward the top surface) or downward (toward the bottom surface) at a right angle from the end of counter electrode 25 close to the back surface.

Oscillation electrode 24 and counter electrode 25 are fixed to an upper portion and a lower portion of electrode holding board 52, respectively. Matching circuit 23 and incident-reflected wave detector 51 are fixed on electrode holding board 52. Oscillation electrode 24 and counter electrode 25 are reliably held by electrode holding board 52. As described above, electrode holding board 52 substantially reliably holds oscillation electrode 24 and counter electrode 25 with a predetermined distance (H in FIG. 8). Electrode holding board 52 includes matching circuit 23 and the like, and thus has high rigidity due to a copper foil wiring pattern. Thus, electrode holding board 52 can hold each of oscillation electrode 24 and counter electrode 25 in a cantilever manner in a state where a predetermined counter interval (H in FIG. 8) is provided between oscillation electrode 24 and counter electrode 25. As described above, electrode holding board 52 may be further provided with oscillation circuit 22 and the like.

Anode terminals 24a to 24c of oscillation electrode 24 and cathode terminals 25a to 25c of counter electrode 25 are connected to corresponding connection terminals of matching circuit 23 on an anode side and a cathode side, respectively. Anode terminals 24a to 24c and cathode terminals 25a to 25c are connected to the corresponding connection terminals of matching circuit 23 by surface contact connection having a predetermined contact area enough to secure reliability even when a large current flows. In the first exemplary embodiment, the terminals each having a flat plate shape are connected to each other by screwing to secure reliable surface contact connection. The connection between the terminals is not limited to the connection by screwing as long as the connection means achieves reliable surface contact connection.

In the first exemplary embodiment, each of anode terminals 24a to 24c protruding from the end of oscillation electrode 24 close to the back surface has terminal width w (see FIG. 8) narrower than electrode width W (see FIG. 8) of the end of oscillation electrode 24 close to the back surface (w<W). This is because heat generated in matching circuit 23 is less likely to be conducted to oscillation electrode 24, and reduction in heat conduction between matching circuit 23 and oscillation electrode 24 suppresses occurrence of dew condensation in matching circuit 23 when oscillation electrode 24 is cooled. Each of cathode terminals 25a to 25c of counter electrode 25 is also formed to have a terminal width narrower than an electrode width of an end of counter electrode 25 close to the back surface, from which cathode terminals 25a to 25c protrude, as with the terminal width of each of anode terminals 24a to 24c. Narrowing the terminal width of each of cathode terminals 25a to 25c as described above reduces heat conduction between counter electrode 25 and matching circuit 23.

The configuration with oscillation circuit 22 disposed in electrode holding region 30 may include a heat sink being a heat dissipation member in oscillation circuit 22 to bring the heat sink into contact with air passage 12 for cooling.

As described above, electrode holding board 52 is provided behind freezing-thawing chamber 6, as the electrode holding mechanism. This allows oscillation electrode 24 and counter electrode 25 to face each other substantially parallel to each other. In the first exemplary embodiment, oscillation electrode 24 and counter electrode 25 are formed as high-frequency heating module 53a to further ensure that oscillation electrode 24 and counter electrode 25 face each other substantially parallel to each other. High-frequency heating module 53a includes oscillation electrode 24, counter electrode 25, and electrode holding board 52 that are integrated while oscillation electrode 24 and counter electrode 25 are fixed in a substantially parallel state, and then is incorporated into freezing-thawing chamber 6.

[1-5. Structure of Freezing-Thawing Chamber]

As described above, heat-insulating box 2 of refrigerator 1 includes outer box 3 formed of a steel plate, inner box 4 made of resin, and heat insulator 40 (e.g., hard urethane foam) filled and foamed in a space between outer box 3 and inner box 4.

Figure 2:
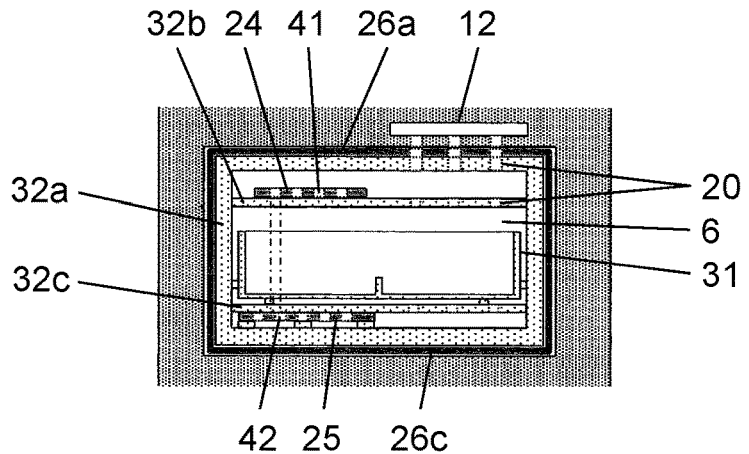
FIG. 2 is a front sectional view illustrating a freezing-thawing chamber in the refrigerator according to the first exemplary embodiment.
Figure 3:
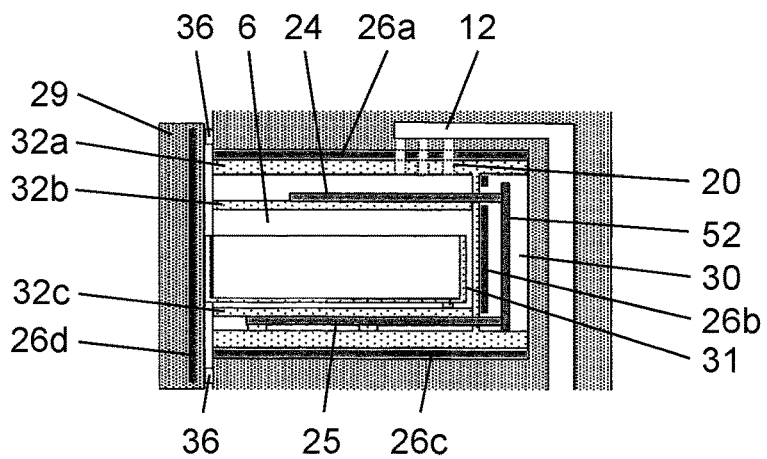
FIG. 3 is a side sectional view illustrating the freezing-thawing chamber in the refrigerator according to the first exemplary embodiment.

As illustrated in FIGS. 2 and 3, freezing-thawing chamber 6 includes inner surface member 32a inward of heat insulator 40, serving as an outer frame. The outside of freezing-thawing chamber 6 is covered with electromagnetic wave shield 26 (26a to 26d). This electromagnetic wave shield 26 is provided surrounding freezing-thawing chamber 6 to prevent an electromagnetic wave from leaking to the outside of refrigerator 1. Electrode holding region 30 is divided from freezing-thawing chamber 6 by inner surface member 32a. Back-side electromagnetic wave shield 26b is installed behind inner surface member 32a. Back-side electromagnetic wave shield 26b mainly serves to partition the inside of freezing-thawing chamber 6 and electrode holding board 52 including matching circuit 23 and the like to prevent an influence on mutual impedance and an electric field.

Inner surface member 32a surrounds a space in which inner surface member 32b in a flat plate-like shape is provided horizontally in an upper portion and oscillation electrode 24 is mounted on or above inner surface member 32b. Additionally, inner surface member 32c in a flat plate-like shape is provided horizontally in a lower portion in the space surrounded by inner surface member 32a, and counter electrode 25 is installed on a lower surface of inner surface member 32c. The lower surface of inner surface member 32c and inner surface member 32b are substantially parallel to each other and held at a predetermined distance (H in FIG. 8). Thus, oscillation electrode 24 and counter electrode 25 are held in a substantially parallel state by electrode holding board 52 and inner surface members 32a, 32b, 32c. Outer box 3 may be formed with an inner upper surface and a bottom surface that are insufficiently parallel to each other due to foaming variation of filled and foamed heat insulator 40. For this matter, the above-described configuration enables oscillation electrode 24 and counter electrode 25 to be brought into a substantially parallel state accurately and reliably without being affected by foaming.

Figure 4:
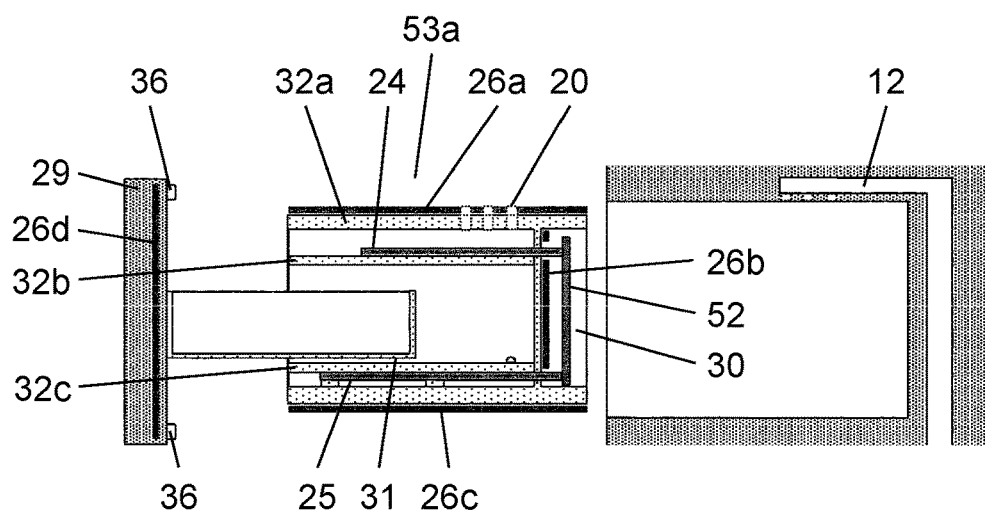
FIG. 4 is a longitudinal sectional view when the freezing-thawing chamber is incorporated in the refrigerator according to the first exemplary embodiment.

High-frequency heating module 53a is assembled in advance such that high-frequency heating module 53a is incorporated by being inserted into outer box 3 of refrigerator 1 as illustrated in FIG. 4 in the manufacturing process of refrigerator 1. Subsequently, a door unit including door 29, door-side electromagnetic wave shield 26d, gasket 36, housing case 31, and the like is inserted into high-frequency heating module 53a to complete the refrigerator.

Figure 5:
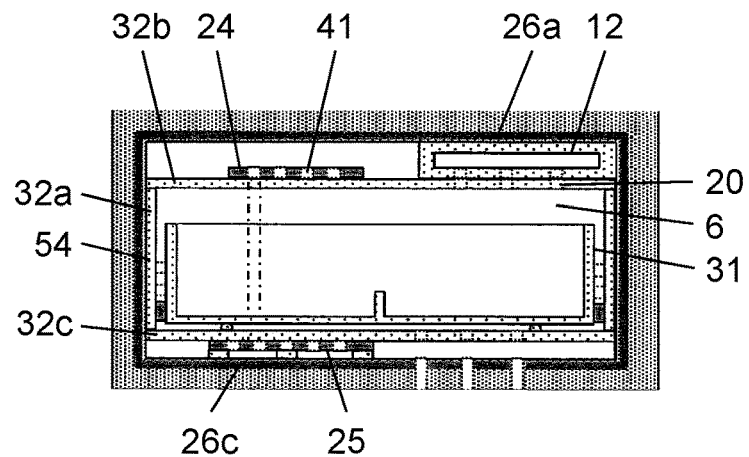
FIG. 5 is a front sectional view illustrating a modification of the freezing-thawing chamber in the refrigerator according to the first exemplary embodiment.
Figure 6:
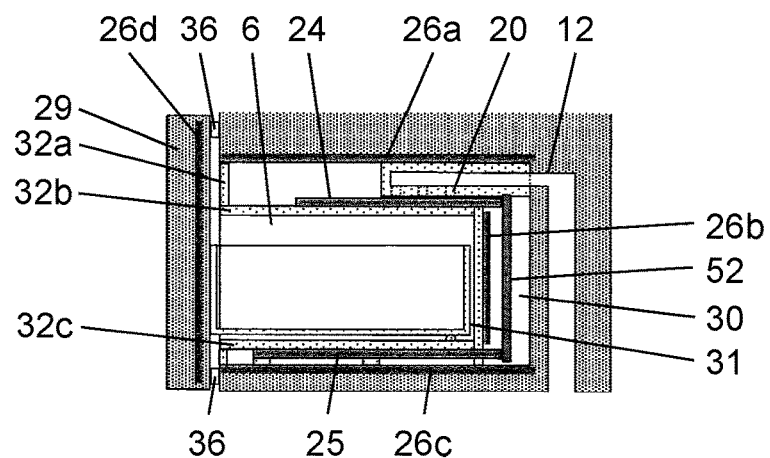
FIG. 6 is a side sectional view illustrating the modification of the freezing-thawing chamber in the refrigerator according to the first exemplary embodiment.
Figure 7:
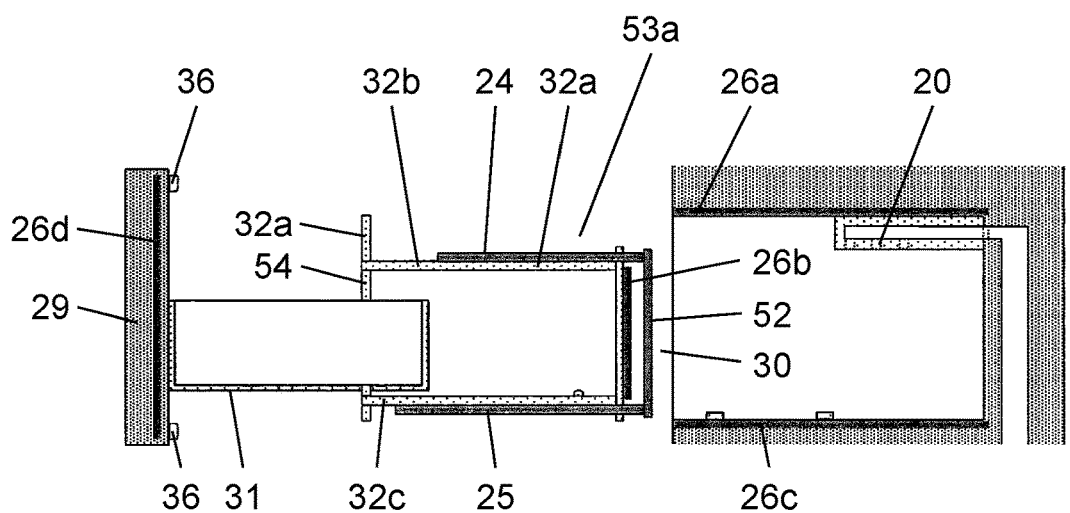
FIG. 7 is a longitudinal sectional view when the freezing-thawing chamber is incorporated in the refrigerator according to the first exemplary embodiment.

FIGS. 5, 6, and 7 each illustrate structure that also may be used. FIGS. 5, 6, and 7 each illustrate the structure in which outer box 3 of refrigerator 1, inner box 4 made of resin, heat insulator 40 filled in and foamed in a space between outer box 3 and inner box 4, inner surface members 32 (32a to 32c) inside heat insulator 40, being formed as an outer frame of freezing-thawing chamber 6, and electromagnetic wave shield 26 outside inner surface member 32 are configured similar to those in FIGS. 2 and 3.

Inner surface member 32a surrounds a space in which inner surface member 32b in a flat plate-like shape is provided horizontally in an upper portion. Oscillation electrode 24 is mounted on or above inner surface member 32b. Similarly, inner surface member 32c in a flat plate-like shape is disposed horizontally in a lower portion in the space surrounded by inner surface member 32a. Counter electrode 25 is provided on a lower surface of inner surface member 32c. Inner surface member 32b and inner surface member 32c are each fixed on its front side with strut 54. Inner surface member 32b and inner surface member 32c are each fixed on its back side with electrode holding board 52 and inner surface member 32a, and oscillation electrode 24 and counter electrode 25 are held in a substantially parallel state.

Inner surface member 32b and inner surface member 32c are substantially parallel to each other and held at a predetermined distance (H in FIG. 8), so that oscillation electrode 24 and counter electrode 25 can be held in a substantially parallel state by electrode holding board 52, strut 54, and inner surface members 32b, 32c. Outer box 3 of refrigerator 1 may be formed with an inner upper surface and a bottom surface that are insufficiently parallel to each other due to foaming variation of filled and foamed heat insulator 40. For this matter, the above-described configuration enables oscillation electrode 24 and counter electrode 25 to be brought into a substantially parallel state accurately and reliably without being affected by foaming.

In the above configuration, high-frequency heating module 53a is formed by integrating oscillation electrode 24, counter electrode 25, inner surface members 32a, 32b, 32c, strut 54, back-side electromagnetic wave shield 26b that partitions electrode holding region 30 and freezing-thawing chamber 6, and electrode holding board 52 including matching circuit 23 and the like. High-frequency heating module 53a is assembled in advance such that high frequency heating module 53a is incorporated by being inserted into outer box 3 of refrigerator 1 as illustrated in FIG. 4 in the manufacturing process. Subsequently, a door unit including door 29, door-side electromagnetic wave shield 26d, gasket 36, housing case 31, and the like is inserted into high-frequency heating module 53a to complete refrigerator 1.

Inner surface members 32a to 32c are desirably made of a material having a thermal conductivity of 10 W/(m·k) or less of a general industrial ceramic material that is less likely to cause dew condensation even in an environment of a freezing chamber. In the present exemplary embodiment, inner surface members 32a to 32c are made of a resin material such as polypropylene, acrylonitrile butadiene styrene (ABS) resin, or polycarbonate. Electromagnetic wave shields 26 (26a to 26d) are each formed with a thickness smaller than that of each inner surface member 32 (32a to 32c) to reduce heat capacity. This enables preventing dew condensation on electromagnetic wave shield 26 and inner surface members 32 (32a to 32c) in contact with electromagnetic wave shield 26.

As described above, refrigerator 1 of the first exemplary embodiment includes the electrode holding mechanism provided behind, in fort of, and on a lateral side of the dielectric heating mechanism of freezing-thawing chamber 6. This enables oscillation electrode 24 and counter electrode 25 to be disposed with an accurate opposing interval therebetween. Thus, oscillation electrode 24 and counter electrode 25 can be reliably disposed substantially parallel to each other at a predetermined interval (H in FIG. 8). As a result, the dielectric heating mechanism of freezing-thawing chamber 6 prevents deviation in a high-frequency electric field on an electrode surface to uniformize the high-frequency electric field, and thus can uniformly perform thawing treatment on a preserved product (frozen product). Additionally, a refrigerator is completed by inserting a unit assembled in advance as a high-frequency heating module, so that manufacturing operation does not need to be performed in a narrow refrigerator, thereby simplifying a manufacturing process.

[1-6. Electromagnetic Wave Shielding Mechanism]

As described above, freezing-thawing chamber 6 is configured such that a dielectric being a preserved product is disposed in an atmosphere of a high-frequency electric field between oscillation electrode 24 and counter electrode 25 to heat the dielectric by dielectric heating. This causes electromagnetic waves to be radiated in freezing-thawing chamber 6. To prevent the electromagnetic waves from leaking to the outside of refrigerator 1, refrigerator 1 of the first exemplary embodiment is provided with an electromagnetic wave shielding mechanism surrounding freezing-thawing chamber 6.

As illustrated in FIGS. 2 and 3, top-side electromagnetic wave shield 26a is disposed in a portion of air passage 12 close to the top surface of freezing-thawing chamber 6. Top-side electromagnetic wave shield 26a is disposed on a lower surface of heat insulator 40 constituting a bottom surface side of refrigerating chamber 5 (see FIG. 1) immediately above freezing-thawing chamber 6 to cover the top surface side of freezing-thawing chamber 6. Top-side electromagnetic wave shield 26a is configured to have a plurality of openings to reduce a substantial facing area with respect to oscillation electrode 24.

In the present exemplary embodiment, the openings each have a slit shape with a longitudinal direction from a back surface side toward a front surface side. The openings of top-side electromagnetic wave shield 26a allow a magnetic field (current) generated forward from anode terminals 24a to 24c to smoothly pass over top-side electromagnetic wave shield 26a, so that a magnetic field leaked and diffused to the surroundings is reduced according to analysis using electromagnetic wave simulation.

Top-side electromagnetic wave shield 26a, configured as described above, suppresses generation of an unnecessary electric field between top-side electromagnetic wave shield 26a and oscillation electrode 24. Top-side electromagnetic wave shield 26a may have a mesh structure having a plurality of openings. Top-side electromagnetic wave shield 26a may be provided inside refrigerating chamber 5 located immediately above freezing-thawing chamber 6. Refrigerating chamber 5 is often provided with a partial freezing chamber or a chilling chamber, and a top surface of the partial freezing chamber or the chilling chamber may be used as an electromagnetic wave shield.

Back-side electromagnetic wave shield 26b is disposed covering electrode holding region 30 provided behind freezing-thawing chamber 6. In electrode holding region 30, matching circuit 23 and the like are disposed. When back-side electromagnetic wave shield 26b is provided as described above, operation (control) of electric components of cooling fan 14 and damper 12a is prevented from being affected by an electric field generated between oscillation electrode 24 and counter electrode 25, high-frequency noise generated by matching circuit 23, and the like. Freezing-thawing chamber 6 is provided also on its side surface side with an electromagnetic wave shield (not illustrated).

Next, door-side electromagnetic wave shield 26d provided on door 29 that opens and closes a front side opening of freezing-thawing chamber 6 will be described. Door 29 is configured to open and close a body of refrigerator 1. Thus, when an electromagnetic wave shield provided on door 29 is connected to a grounded portion of the body of refrigerator 1 with a wired path, the wired path repeats expansion and contraction due to opening and closing of door 29, thereby accumulating metal fatigue in the wired path. This kind of connection may cause a disconnection in the wired path. Thus, connection between door-side electromagnetic wave shield 26d provided on door 29 and the grounded portion of the body of refrigerator 1 with a wired path is not preferable.

In general, to prevent leakage of an electromagnetic wave, door-side electromagnetic wave shield 26d and cross rail 21 that is connected to outer box 3 and illustrated in FIG. 1 and that serves as an electromagnetic wave shield close to the body of refrigerator 1 are required to be disposed at an interval shorter than ¼ of wavelength λ of the electromagnetic wave when door 29 is closed. In the first exemplary embodiment, when the interval between door-side electromagnetic wave shield 26d and cross rail 21 is further reduced, a ground effect of the electromagnetic wave shield can be obtained without providing a wired path between door-side electromagnetic wave shield 26d and cross rail 21. For example, the interval between door-side electromagnetic wave shield 26d and cross rail 21 when door 29 is closed is set to 30 mm or less. Cross rail 21 connected to outer box 3 is grounded, so that bringing door-side electromagnetic wave shield 26d and cross rail 21 close to each other when the door 29 is closed enables obtaining an effect equivalent to grounding by a wired path. When door-side electromagnetic wave shield 26d has a shape bent toward the body of refrigerator 1 at its end, door-side electromagnetic wave shield 26d can be easily brought close to cross rail 21.

Door-side electromagnetic wave shield 26d may be configured to be close to, for example, electromagnetic wave shield 26 (26a, 26c) other than cross rail 21.

Next, connection between an electromagnetic wave shield and other circuits, and the ground will be described.

Figure 10:
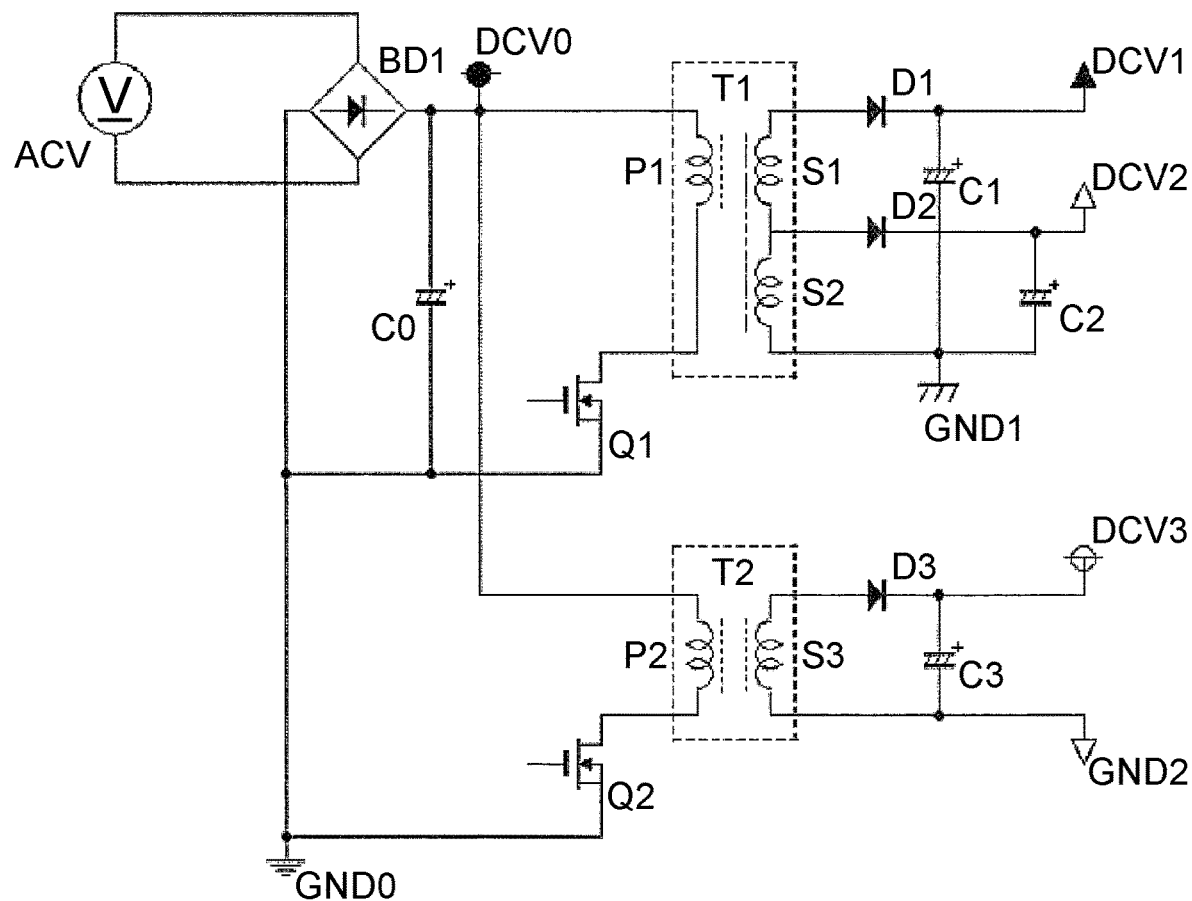
FIG. 10 is a schematic circuit diagram of an AC/DC converter that drives various circuits.

FIG. 10 is a schematic circuit diagram of an alternating current (AC)-direct current (DC) converter that drives various circuits. The circuit includes a flyback switching power supply circuit that is used as a DC-DC converter disposed behind bridge diode BD1 and rectifier capacitor C0 that rectify power from AC commercial power supply ACV. However, the DC-DC converter is not limited to this, and may be a switching power supply of a system using a transformer, such as a forward system, a push-pull system, or a half-bridge system. The circuit of FIG. 10 illustrates only main circuit components, and does not illustrate a noise filter, a power supply control circuit, a protection circuit, and the like.

An AC current from AC commercial power supply ACV is converted into a DC current by bridge diode BD1 and rectifier capacitor C0 that are referred to as primary DC power supply DCV0 (first power supply part). Primary-side DC power supply DCV0 has a zero-volt reference potential that is defined as primary-side ground GND0 (first ground part).

Primary-side DC power supply DCV0 is applied to primary-side winding P1 of switching transformer T1, and is switched at a frequency of several 10 kHz by field effect transistor (FET) Q1. Primary-side winding P1 accumulates power that is transmitted to secondary-side winding S1, which is electrically insulated, by electromagnetic induction, and that is rectified by secondary-side rectifier diode D1 and secondary-side rectifier capacitor C1. Then, voltage at secondary-side DC power supply DCV1 is output. Secondary-side winding S2 is provided with an output part between both ends of its winding, and accumulates power that is rectified by secondary-side rectifier diode D2 and secondary-side rectifier capacitor C2. Then, the output part outputs voltage at secondary-side DC power supply DCV2 that lower than that at secondary-side DC power supply DCV1. Secondary-side DC power supplies DCV1, DCV2 (second power supply parts) have a zero-volt reference potential that is referred to as secondary-side ground GND1 (second ground part).

Primary-side DC power supply DCV0 is applied to not only switching transformer T1, but also primary-side winding P2 of switching transformer T2 by being branched, and is switched at a frequency of several 10 kHz by FET Q2. Primary-side winding P2 accumulates power that is transmitted to secondary-side winding S3, which is electrically insulated, by electromagnetic induction, and that is rectified by secondary-side rectifier diode D3 and secondary-side rectifier capacitor C3. Then, voltage at secondary-side DC power supply DCV3 (third power supply part) is output. Secondary-side DC power supply DCV3 has a zero-volt reference potential that is defined as secondary-side ground GND2 (third ground part).

Insulation between primary-side winding P1 and secondary-side winding S1 in switching transformer T1, and insulation between primary-side winding P2 and secondary-side winding S3 in switching transformer T2, are performed to be equal to or higher than basic insulation defined by the Electrical Appliances and Materials Safety Act of Japan or the International Electrotechnical Commission (IEC) standard.

As illustrated in FIG. 9, oscillation circuit 22 includes oscillation source 22a using crystal or the like that outputs a fine power of 40.68 MHz allocated to an industrial, scientific and medical (ISM) band, first amplifier circuit 22b that slightly amplifies the fine power, and second amplifier circuit 22c that further amplifies the fine power and outputs the fine power toward matching circuit 23. The output frequency of oscillation source 22a is not limited to 40.68 MHz.

In the present exemplary embodiment, power from secondary DC power supply DCV1 is supplied to second amplifier circuit 22c in oscillation circuit 22, power from secondary DC power supply DCV2 is supplied to oscillation source 22a and first amplifier circuit 22b in oscillation circuit 22, incident-reflected wave detector 51, and matching circuit 23, and power from secondary DC power supply DCV3 is supplied to controller 50.

As a result, a circuit system with secondary-side ground GND1 set to the zero volt reference potential includes oscillation circuit 22, incident-reflected wave detector 51, matching circuit 23, and counter electrode 25. Then, a circuit system with secondary side ground GND2 set to the zero volt reference potential includes controller 50.

Each electromagnetic wave shield 26 (top-side electromagnetic wave shield 26a, bottom-side electromagnetic wave shield 26c, back-side electromagnetic wave shield 26b, and door-side electromagnetic wave shield 26d) is desirably insulated from counter electrode 25 (equal in potential to secondary-side ground GND1), or is desirably connected to counter electrode 25 by being away from counter electrode 25 by a predetermined distance or more when not insulated. This reduces an electric field and a magnetic field applied to each electromagnetic wave shield, and also suppresses leakage to the outside. That is, the effect of the electromagnetic wave shield is enhanced.

Several means for enhancing the effect of the electromagnetic wave shield will be described below.

One means does not allow each electromagnetic wave shield to be connected to any of primary-side ground GND0, secondary-side ground GND1, and secondary-side ground GND2. This means is particularly effective when the electromagnetic wave shield has a total area or a total volume that is equal to or more than a predetermined value, and can suppress an adverse effect as noise due to leakage of high frequency waves to the outside through a ground line.

Another means is for connecting each electromagnetic wave shield to primary-side ground GND0. Primary side ground GND0 is usually connected to outer box 3 made of a metal material, and thus has a large ground contact area. Thus, the zero volt reference potential of primary-side ground GND0 is most stable, so that connecting each electromagnetic wave shield to primary-side ground GND0 enables not only enhancing the effect of each electromagnetic wave shield, but also suppressing malfunction due to noise.

Yet another means is for connecting each electromagnetic wave shield to secondary-side ground GND2. This means causes counter electrode 25 and each electromagnetic wave shield to be insulated in two stages of switching transformers T1, T2, so that high-frequency noise is less likely to leak from oscillation electrode 24 to each electromagnetic wave shield, and thus electric field generation between oscillation electrode 24 and counter electrode 25 is stabilized.

Yet another means is for connecting each electromagnetic wave shield to secondary-side ground GND1 while each electromagnetic wave shield is connected to counter electrode 25 at a place away from counter electrode 25 by a predetermined distance or more, at least outside each electromagnetic wave shield. This means enables not only obtaining a constant shielding effect, but also causing high frequency noise to be less likely to leak from oscillation electrode 24 to each electromagnetic wave shield, so that the electric field generation between oscillation electrode 24 and counter electrode 25 is stabilized.

The above means for enhancing the shielding effect may have different effects depending on structure, wiring, and the like of the system, so that optimum means needs to be selected in consideration of efficiency of the electric field generation from oscillation electrode 24 to counter electrode 25, electromagnetic wave shielding effect, and the like.

Refrigerator 1 of the first exemplary embodiment includes outer box 3 that is made of a steel plate, and thus the steel plate itself has a function as an electromagnetic wave shield. Thus, the electromagnetic wave inside refrigerator 1 is reliably prevented from leaking to the outside of refrigerator 1.

[1-7. Configuration of Oscillation Electrode and Counter Electrode]

Figure 11:
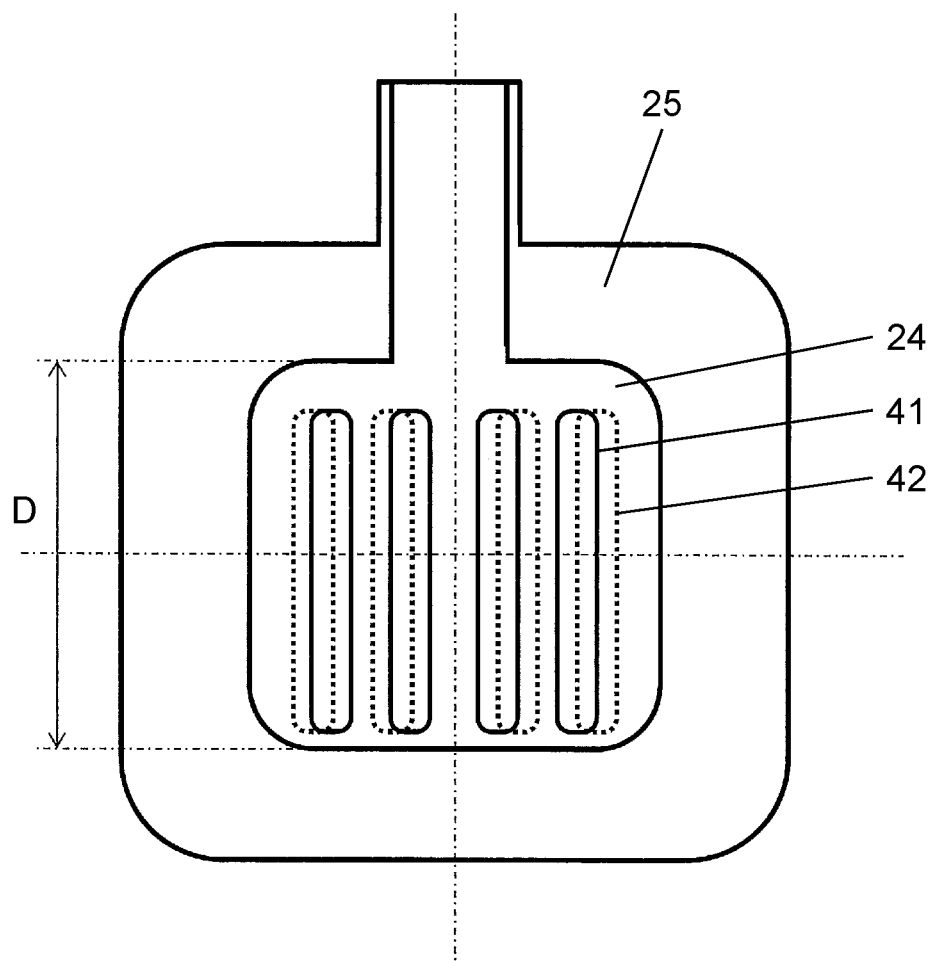
FIG. 11 is a plan view of an oscillation electrode and a counter electrode close to a top surface of the freezing-thawing chamber of the refrigerator according to the first exemplary embodiment as viewed from above.

FIG. 11 is a plan view of oscillation electrode 24 and counter electrode 25 close to the top surface of freezing-thawing chamber 6 as viewed from above.

As illustrated in FIG. 11, oscillation electrode 24 is configured to have an area slightly smaller than that of counter electrode 25. Oscillation electrode 24 and counter electrode 25 are each provided with a plurality of electrode holes 41, 42. Electrode holes 41, 42 each have a vertically long slit shape extending forward from a back side in the refrigerator, on which anode terminals 24a to 24c and cathode terminals 25a to 25c of counter electrode 25 are provided. The shape described above allows a high frequency current input from anode terminals 24a to 24c to easily flow forward from the back side in the refrigerator, so that field intensity generated between both electrodes is slightly increased.

In the present exemplary embodiment, electrode holes 41, 42 provided in oscillation electrode 24 and counter electrode 25, respectively, are not disposed vertically in a symmetric manner, but are disposed at positions away from each other horizontally by about half of a minor axis of electrode hole 41, as illustrated in FIG. 11. The plurality of electrode holes 41 is formed on an electrode surface of oscillation electrode 24, so that a region with an electric field strongly formed is uniformly dispersed on the electrode surface of oscillation electrode 24. This enables a preserved product to be uniformly heated by dielectric heating. That is, an edge of electrode hole 41 serves as an electric field concentration region.

Shapes and placement of electrode holes 41, 42 illustrated in FIG. 11 are exemplary, and the shapes and placement of electrode holes 41, 42 are appropriately designed in consideration of efficiency and manufacturing cost depending on specifications and configurations of a refrigerator. For example, electrode holes 41, 42 each may have the shape of a perfect circle. Electrode holes 41 of oscillation electrode 24 and counter electrode 25 are desirably disposed away from each other horizontally by about half of a hole diameter instead of being disposed at vertically symmetric positions.

Although the configuration of the first exemplary embodiment is described in which the shape and placement of the plurality of electrode holes 41 provided in oscillation electrode 24 are described, the present disclosure is not limited to the above configuration. For example, oscillation electrode 24 may have a shape in which at least one opening is formed. In this case, the electrode surface of oscillation electrode 24 includes an edge of the opening, serving as an electric field concentration region where an electric field is concentrated. The present disclosure allows any configuration in which an electric field concentration region is dispersed in the electrode surface of oscillation electrode 24. Although the configuration of the first exemplary embodiment is described in which the plurality of electrode holes 42 is provided in the electrode surface of counter electrode 25, the present disclosure is not limited to the configuration. That is, an opening may be formed in counter electrode 25 only to form a desired electric field between counter electrode 25 and oscillation electrode 24.

Electrode holding board 52 is configured to reliably hold oscillation electrode 24 and counter electrode 25 with a predetermined distance (H in FIG. 8). In the present exemplary embodiment, electrode interval H is shorter than a long side dimension (D in FIG. 11) of oscillation electrode 24. When the oscillation electrode has a circular shape, electrode interval H is preferably shorter than a diameter of the oscillation electrode. When the oscillation electrode has an elliptical shape, electrode interval H is preferably shorter than a major axis of the oscillation electrode.

Figure 12:
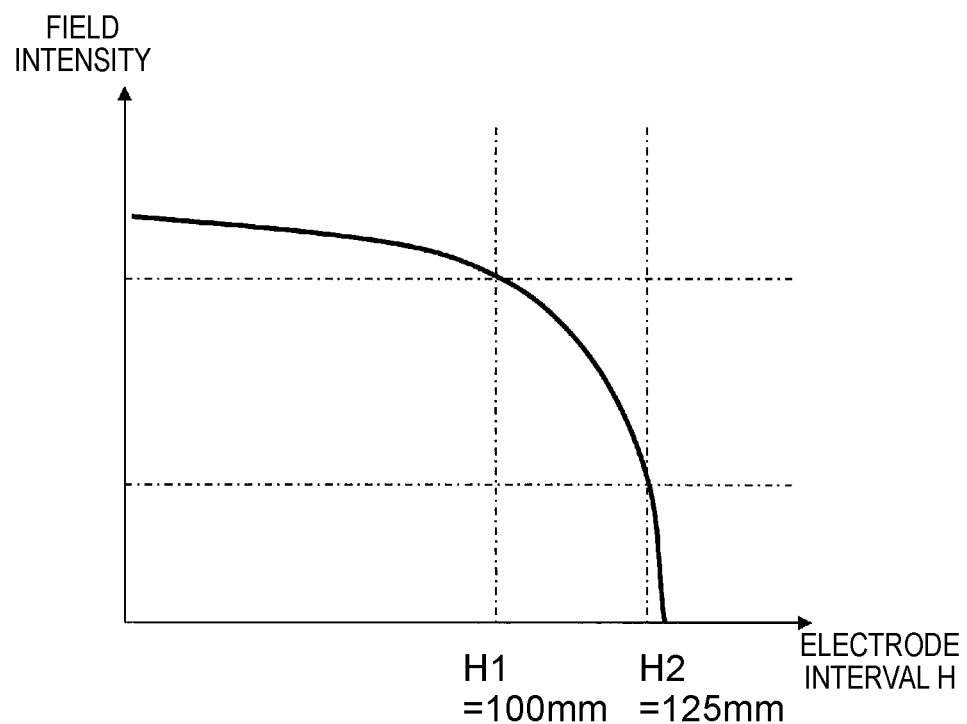
FIG. 12 is a graph showing a relationship between an electrode interval between the oscillation electrode and the counter electrode, and field intensity between both the electrodes.

FIG. 12 shows a relationship between electrode interval H (see FIG. 8) between oscillation electrode 24 and counter electrode 25, and field intensity between both the electrodes. As shown in FIG. 12, the field intensity tends to decrease as electrode interval H increases. In particular, when an electrode interval exceeds electrode interval H1 (100 mm), the field intensity remarkably decreases. When the electrode interval exceeds electrode interval H2 (125 mm), the field intensity decreases to a level at which heating capability using high frequency waves cannot be obtained. From the above, electrode interval H is desirably less than or equal to 100 mm, and needs to be at least less than or equal to 125 mm.

The inventors simulate generation of an electric field between electrodes by using freezing-thawing chamber 6 having the electrode configuration of the first exemplary embodiment and freezing-thawing chamber 6 having an electrode configuration provided with counter electrode 25 having no electrode hole as a comparative example.

Figure 13A:
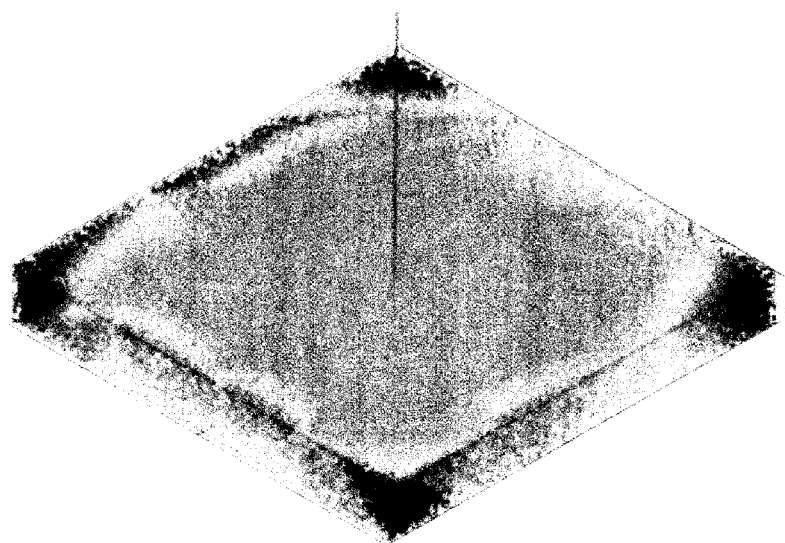
FIG. 13A illustrates a result of performing electric field simulation on a dielectric heating configuration in a comparative example.
Figure 13B:
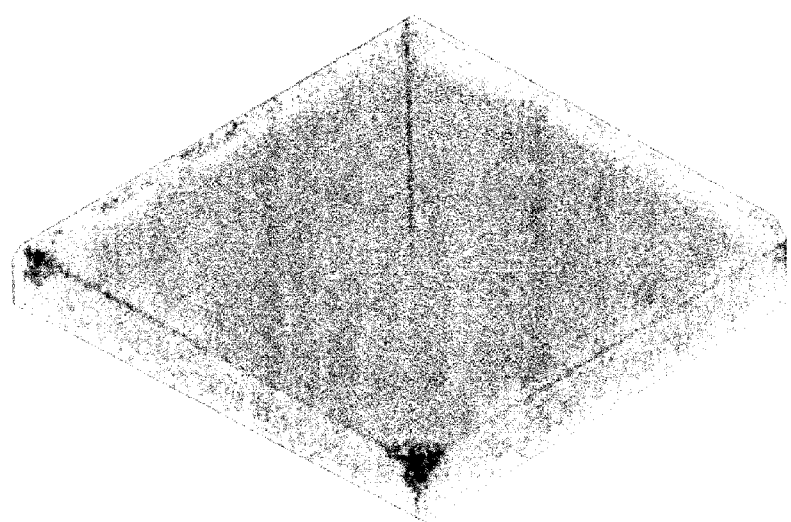
FIG. 13B illustrates a result of performing the electric field simulation on the dielectric heating configuration of the freezing-thawing chamber in the refrigerator according to the first exemplary embodiment.

FIG. 13A illustrates a simulation result in an electrode configuration with oscillation electrode 24 or counter electrode 25, having no electrode hole. FIG. 13B illustrates a simulation result in an electrode configuration with oscillation electrode 24 or counter electrode 25, having an electrode hole. FIGS. 13A and 13B each illustrate a dark color portion indicating a region where an electric field is concentrated. These electric field simulation diagrams can be clearly understood that the electric field simulation diagram of the dielectric heating configuration of FIG. 13B indicates that electric field concentration is alleviated in the entire electrode to uniformize the electric field as compared with the electric field simulation diagram of FIG. 13A.

As illustrated in FIG. 11, electrode hole 41 of oscillation electrode 24 and electrode hole 42 of counter electrode 25 are disposed with central axes extending in a vertical direction (opposing direction) that do not align with each other, whereby the electric field concentration is alleviated in the entire each electrode. In an electrode configuration in which electrode hole 41 of oscillation electrode 24 and electrode hole 42 of counter electrode 25 are disposed with the central axes extending in the vertical direction (opposing direction) that align with each other, concentration of an electric field is alleviated, and particularly, the concentration of the electric field at a corner is alleviated, as compared with a configuration using counter electrode 25 having no electrode hole.

As illustrated in FIGS. 2 and 3, freezing-thawing chamber 6 of refrigerator 1 of the first exemplary embodiment is configured such that housing case 31 is fixed behind door 29, and housing case 31 moves back and forth inside freezing-thawing chamber 6 as door 29 is closed and opened. In the configuration of the first exemplary embodiment, freezing-thawing chamber 6 is provided inside its both side surfaces with rails such that housing case 31 can smoothly move inside freezing-thawing chamber 6. Housing case 31 is also provided outside on its both side surfaces with sliding members that slide on the rails. The rails and the sliding members of the frame (housing case 31) are provided at positions outside a dielectric heating region where oscillation electrode 24 and counter electrode 25 of freezing-thawing chamber 6 face each other to be prevented from being heated by dielectric heating.

[1-8. Thawing Treatment Operation]

When a thaw command is input in refrigerator 1 of the first exemplary embodiment, thawing treatment is performed on a preserved product (frozen product) disposed between oscillation electrode 24 and counter electrode 25 of freezing-thawing chamber 6. As described later, the thawing treatment in the first exemplary embodiment is performed such that controller 50 controls not only the dielectric heating mechanism including oscillation circuit 22, incident-reflected wave detector 51, and matching circuit 23, but also the cooling mechanism including the refrigeration cycle such as compressor 19 and cooler 13, and a cold air introduction mechanism including cooling fan 14, damper 12a, and the like.

The thawing treatment in the first exemplary embodiment is performed such that predetermined high-frequency voltage is applied between oscillation electrode 24 and counter electrode 25, and then a frozen product being a dielectric is heated by dielectric heating using a high-frequency electric field generated between the electrodes. During the dielectric heating, controller 50 intermittently introduces cold air by controlling opening and closing of damper 12a. FIG. 14 shows not only waveforms of control signals of the dielectric heating mechanism (oscillation circuit 22) and the cold air introduction mechanism (damper 12a) in the thawing treatment, but also a food temperature, a room temperature of freezing-thawing chamber 6, and a humidity of freezing-thawing chamber 6, during the thawing treatment.

When a VHF wave is used for the thawing treatment, "partial boiling" is less likely to occur due to its frequency characteristics than when a microwave is used. Refrigerator 1 of the first exemplary embodiment includes electrode holding board 52 to further improve thawing uniformity, and oscillation electrode 24 and counter electrode 25, which are each a substantially planar plate-like member, are reliably held substantially parallel to each other with a predetermined interval (H in FIG. 8) by electrode holding board 52.

As shown in FIG. 14, the thawing treatment is performed such that when a thaw command is input (start of thawing), oscillation circuit 22 is turned on to apply a high-frequency voltage of, for example, 40.68 MHz between oscillation electrode 24 and counter electrode 25. At this time, damper 12a is in an open state, so that room temperature of freezing-thawing chamber 6 is maintained at freezing temperature t1 (e.g., −20° C.). Damper 12a is closed after elapse of a predetermined period of time from the start of thawing. When damper 12a is closed, the room temperature of freezing-thawing chamber 6 starts to rise. The thawing treatment in the first exemplary embodiment is performed such that opening and closing control of damper 12a is performed simultaneously with dielectric heating to suppress a rise in surface temperature of a frozen product, thereby performing thawing without causing so-called "partial boiling".

The opening and closing control of damper 12a is performed by controller 50 based on a ratio (reflectance) of a reflected wave to an incident wave detected by incident-reflected wave detector 51. Here, the incident wave is an electromagnetic wave matched by matching circuit 23 and supplied between oscillation electrode 24 and counter electrode 25. When the reflectance increases to reach a preset threshold, controller 50 opens damper 12a to lower internal temperature of freezing-thawing chamber 6. As described above, cold air is intermittently introduced into freezing-thawing chamber 6 by opening and closing control of damper 12a, so that a preserved product in a storage space (thawing space) of freezing-thawing chamber 6 is heated by dielectric heating while a desired frozen state is maintained, thereby reaching a desired thaw state.

The thawing treatment is completed when the preserved product reaches the desired thaw state. To detect a desired thaw state in which the thawing treatment is completed, reflectance is used in the thawing treatment of the first exemplary embodiment. As the preserved product is melted more by dielectric heating, melted water molecules increase in the preserved product. As the melted water molecules increase in the preserved product, a dielectric constant changes to deviate an impedance matching state. As a result, the reflectance, which is a ratio of a reflected wave to an output electromagnetic wave, increases. When the reflectance increases to reach a preset threshold in the thawing treatment, matching circuit 23 performs impedance matching to reduce the reflectance.

Completion of thawing in the thawing treatment of the first exemplary embodiment is determined when a reflectance after impedance matching is performed by matching circuit 23 exceeds a threshold value of completion of thawing. The threshold value of the completion of thawing is a reflectance when a preserved product melts to reach a desired thaw state. Here, the desired thaw state of a preserved product allows a woman to cut the preserved product with one hand and the amount of drip from the preserved product to be very small. The threshold value of completion of thawing is obtained in advance by an experiment.

As shown in FIG. 14, opening and closing control of damper 12*a* allows cold air having a relatively low humidity and having passed through air passage 12 to be supplied to freezing-thawing chamber 6 through cold air introduction hole 20, so that freezing-thawing chamber 6 does not have a humidity of 100%. Thus, dew condensation in freezing-thawing chamber 6 is prevented from occurring.

A method for calculating the reflectance is not limited to that for calculating a ratio (reflectance) of a reflected wave to an incident wave detected by incident-reflected wave detector 51. For example, the detector may detect only a reflected wave, and oscillation circuit 22 may calculate a reflectance as a ratio of the reflected wave to a preset output.

The thawing treatment may be controlled without using a reflectance. For example, regardless of output, the thawing treatment may be controlled only by a reflected wave detected by incident-reflected wave detector 51. Control using a reflectance described in the following description also may be similarly performed using these methods.

[1-9. Control after Completion of Thawing Treatment]

Figure 15:
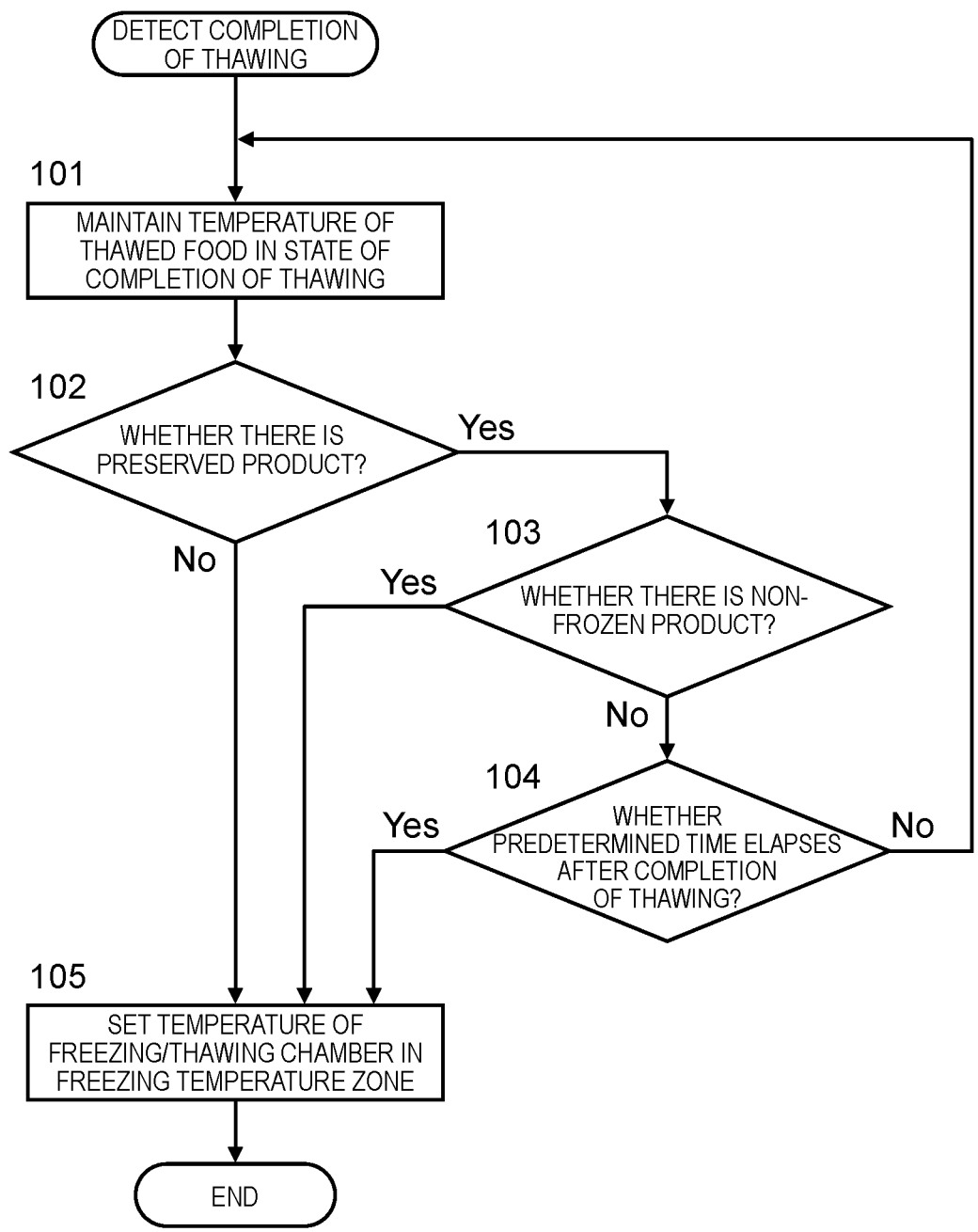
FIG. 15 is a flowchart illustrating control after thawing treatment is completed in the freezing-thawing chamber in the configuration of the first exemplary embodiment.

FIG. 15 is a flowchart illustrating control after the thawing treatment is completed in freezing-thawing chamber 6. Each step illustrated in the flowchart of FIG. 15 is performed by a central processing unit (CPU) of controller 50 executing a control program stored in a memory such as a read only memory (ROM). As described above, when a reflectance after matching circuit 23 performs impedance matching in the thawing treatment exceeds the threshold value of completion of thawing, control after completion of the thawing treatment illustrated in FIG. 15 is performed.

As illustrated in step 101 of FIG. 15, after the thawing treatment is completed, a preserved product is maintained in the desired thaw state. One means for maintaining the preserved product in the desired thaw state is to set room temperature of freezing-thawing chamber 6 to a so-called slight freezing temperature zone, for example, about −1° C. to −3° C. Another means therefor is to set the room temperature of freezing-thawing chamber 6 to a freezing temperature zone, for example, −18° C. to −20° C., and to apply a high-frequency electric field with a reduced output or apply a high-frequency electric field intermittently, thereby performing cooling and heating to maintain the preserved product in a desired temperature zone.

In a state where freezing-thawing chamber 6 is maintained at a slight freezing temperature, freezing-thawing chamber 6 is always determined whether there is a preserved product (step 102). Whether there is a preserved product in freezing-thawing chamber 6 is determined by using a reflectance that is constantly detected. Thus, matching circuit 23 is always intermittently operated, and a low-output electromagnetic wave is intermittently output from oscillation electrode 24. Controller 50 compares the reflectance with a preset threshold value for whether there is a preserved product to determine whether there is a preserved product in freezing-thawing chamber 6.

When it is determined in step 102 that no preserved product exists in freezing-thawing chamber 6 (No in step 102), it is determined that the preserved product in a desired thaw state is taken out, and then the room temperature of freezing-thawing chamber 6 is set to a freezing temperature zone, for example, −18° C. to −20° C. (step 105).

When it is determined in step 102 that a preserved product exists in freezing-thawing chamber 6 (Yes in step 102), it is determined whether the existing preserved product includes a new non-frozen product (e.g., a foodstuff at normal temperature). Whether freezing-thawing chamber 6 contains a new non-frozen product is determined based on a change in reflectance. When it is determined in step 103 that a new non-frozen product is put into freezing-thawing chamber 6 (Yes in step 103), the room temperature of freezing-thawing chamber 6 is set to the freezing temperature zone (step 105).

In contrast, when it is determined in step 103 that no new non-frozen product is accommodated in freezing-thawing chamber 6 and a thawed preserved product is kept held (No in step 103), it is determined whether a time after completion of thawing exceeds a predetermined time (step 104). Even when the thawing treatment for a preserved product is completed, a user may not immediately take out the preserved product from freezing-thawing chamber 6. In such a case, refrigerator 1 according to the first exemplary embodiment is configured to maintain the slight freezing temperature zone, in which a desired thaw state can be maintained, for a predetermined time for a preserved product in freezing-thawing chamber 6. When a preserved product is accommodated in freezing-thawing chamber 6 over the predetermined time, refrigerator 1 according to the first exemplary embodiment performs control to shift a room temperature of freezing-thawing chamber 6 to the freezing temperature zone to maintain freshness of the preserved product. That is, when it is determined in step 104 that the time after completion of thawing exceeds the predetermined time while the preserved product in a thaw state is accommodated (Yes in step 104), processing proceeds to step 105, and then freezing treatment, in which the room temperature of freezing-thawing chamber 6 is set to the freezing temperature zone, is performed.

As described above, refrigerator 1 according to the first exemplary embodiment enables a preserved product in a desired thaw state to be held for a predetermined time, during which freshness can be maintained, in freezing-thawing chamber 6 after the thawing treatment is completed, and enables performing appropriate temperature management on a preserved product inside freezing-thawing chamber 6.

[1-10. Frozen Storage Operation of Freezing-Thawing Chamber]

Refrigerator 1 according to the first exemplary embodiment is configured to perform dielectric heating to freeze and store food being a preserved product in a desired state in freezing treatment in which a room temperature of freezing-thawing chamber 6 is maintained in the freezing temperature zone. In general, when food is frozen, a frosting phenomenon occurs on an inner surface of a food packaging material due to moisture in freezing-thawing chamber 6 and moisture in the food. When such a frosting phenomenon appears on a surface of food, the food is dried to cause dry in texture, and the food is not in a delicious and fresh state ("freezing-baked"). To prevent such a state, refrigerator 1 of the first exemplary embodiment performs dielectric heating operation simultaneously with cooling operation.

Figure 16A:
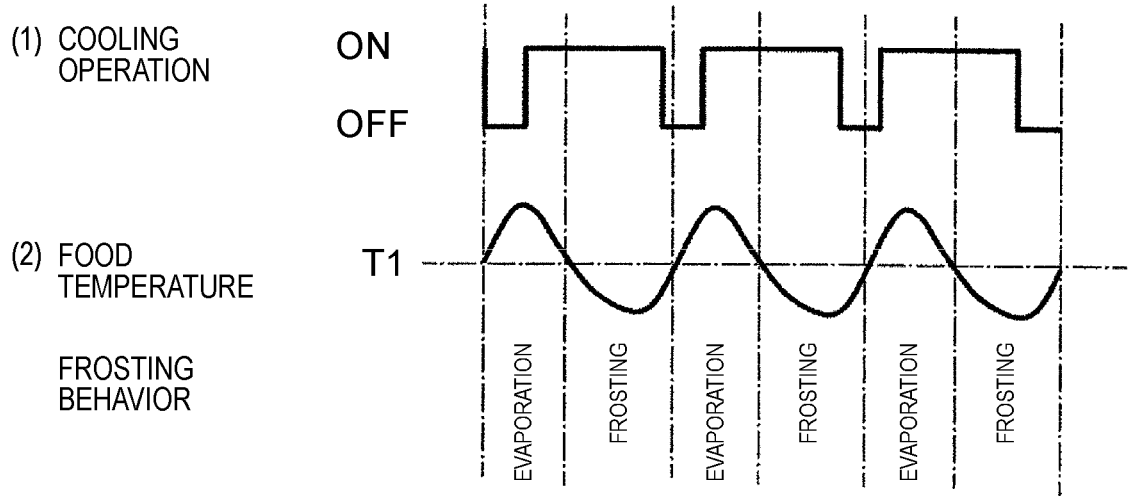
FIG. 16A is a waveform chart showing cooling operation during frozen storage in a conventional refrigerator.
Figure 16B:
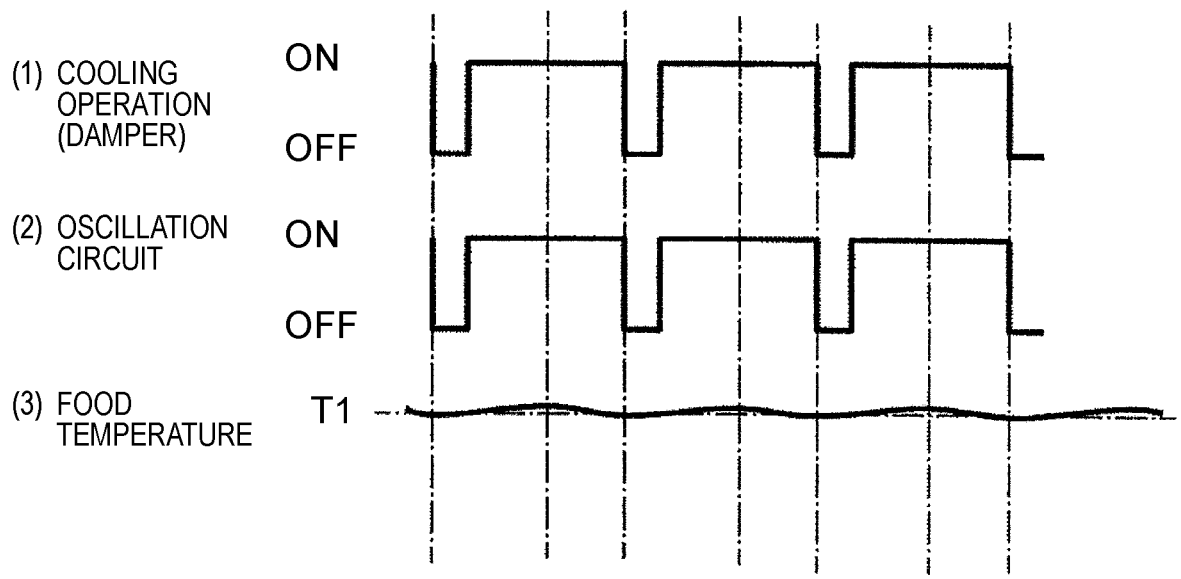
FIG. 16B is a waveform chart showing cooling operation performed in the freezing-thawing chamber of the refrigerator according to the first exemplary embodiment.

FIGS. 16A and 16B are each a waveform chart showing states of respective elements during the cooling operation. FIG. 16A is a waveform chart showing the cooling operation performed during frozen storage in a conventional refrigerator, and FIG. 16B is a waveform chart showing the cooling operation performed in freezing-thawing chamber 6 in refrigerator 1 according to the first exemplary embodiment.

FIG. 16A includes part (1) that is a waveform chart showing ON/OFF of the cooling operation. The ON/OFF of the cooling operation corresponds to, for example, opening and closing of a damper or ON/OFF operation of a compressor. In FIG. 16A, the ON indicates a state in which cold air is introduced into the freezing chamber, and the OFF indicates a state in which the damper is closed and introduction of the cold air into the freezing chamber is blocked. Thus, as illustrated in the waveform chart in part (2) of FIG. 16A, food in the freezing chamber has a temperature that largely changes up and down about freezing temperature T1 (e.g., −20° C.) set in advance. As a result, evaporation of moisture and frosting are repeated on a surface of the food in the freezing chamber, and thus a preferable frozen state of the food may not be obtained.

In contrast, FIG. 16B shows the cooling operation in the first exemplary embodiment in which food is cooled and heated by dielectric heating unlike the conventional cooling operation. FIG. 16B includes part (1) that is a waveform chart showing opening and closing operation of damper 12a. The ON indicates an open state of damper 12a, and cold air is introduced into freezing-thawing chamber 6 from cold air introduction hole 20 through air passage 12. The OFF indicates a closed state of damper 12a, and introduction of cold air into freezing-thawing chamber 6 is blocked. The introduction of cold air in the cooling operation according to the first exemplary embodiment is performed simultaneously with the dielectric heating, so that introduction time of cold air is set longer than that in a conventional example. That is, cooling capacity in the cooling operation is increased.

FIG. 16B includes part (2) that is a waveform chart illustrating an operation state of dielectric heating by drive control of oscillation circuit 22. When damper 12a is in the open state, dielectric heating is simultaneously performed. The dielectric heating is performed with a much smaller output than in thawing operation in the cooling operation in the first exemplary embodiment. As a result, a food temperature in freezing-thawing chamber 6 is maintained at freezing temperature T1 (e.g., −20° C.) set in advance as shown in part (3) of FIG. 16B, and thus fluctuation in the food temperature is suppressed.

According to an experiment, when the food temperature has a variation of about 0.1 K or less, occurrence of frosting can be eliminated. As the fluctuation in the food temperature is reduced at least, the occurrence of frosting can be suppressed. Performing the dielectric heating produces an effect of suppressing extension of an ice crystal inside the food. When the dielectric heating is performed, an electric field tends to gather at the tip of the ice crystal generated in the food, so that the ice crystal extends only slowly even when temperature in freezing-thawing chamber 6 is lower than or equal to that in a maximum ice crystal formation zone.

As described above, refrigerator 1 of the first exemplary embodiment is configured to perform the dielectric heating operation even in the cooling operation during frozen storage. This enables a frozen product being a preserved product to be frozen and stored in a desired state.

[1-11. Freezing Treatment]

Refrigerator 1 of the first exemplary embodiment can perform freezing treatment on a non-frozen food newly put into freezing-thawing chamber 6 based on an instruction of a user from operation unit 47 (see FIG. 9). FIG. 17 is a waveform chart showing a state of each element in rapid cooling operation that is the freezing treatment. FIG. 17 includes part (a) that is a graph showing whether a preserved product (food) exists in freezing-thawing chamber 6. Whether the preserved product exists in freezing-thawing chamber 6 is determined by controller 50 based on a ratio (reflectance) between a reflected wave detected by incident-reflected wave detector 51 and an output electromagnetic wave. FIG. 17 includes part (b) showing that controller 50 intermittently acquires information from matching circuit 23 and incident-reflected wave detector 51. FIG. 17 includes part (c) that is a graph showing an example of transition of reflectance. Controller 50 determines that food being a preserved product is put into freezing-thawing chamber 6 when the reflectance is less than or equal to first threshold R1.

The rapid cooling operation is performed on the food accommodated in freezing-thawing chamber 6 such that compressor 19 and cooling fan 14 of the cooling mechanism are each increased in rotational speed to increase the cooling capacity with which forced continuous operation is performed. The cold air introduction mechanism is driven and controlled such that damper 12a of air passage 12 communicating with freezing-thawing chamber 6 is forcibly driven in a continuously opened state to introduce cold air into freezing-thawing chamber 6 (see a waveform chart in part (d) of FIG. 17).

The rapid cooling operation is performed along with the dielectric heating operation to suppress extension of an ice crystal when a food temperature is in a maximum ice crystal formation zone (about −1° C. to about −5° C.). The dielectric heating operation at this time has a low output of about 1 W to about 10 W, and the dielectric heating operation is intermittently performed (period T in part (e) of FIG. 17). To start the dielectric heating operation, whether the food temperature reaches the maximum ice crystal formation zone is determined. The determination is performed based on that change in reflectance increases when the food passes through a latent heat region. In the first exemplary embodiment, when detected reflectance reaches preset second threshold R2, the dielectric heating operation is started (see part (e) of FIG. 17). A range of the reflectance from second threshold R2 to third threshold R3 lower than second threshold R2 is regarded as the maximum ice crystal formation zone of the food, so that the dielectric heating operation is continued. Controller 50 determines that the food has passed through the maximum ice crystal formation zone when predetermined time (t2) elapses after the reflectance reaches third threshold value R3, and then stops the dielectric heating operation.

As described above, when it is determined that the food has passed through the maximum ice crystal formation zone, the dielectric heating operation is stopped, and the rapid cooling operation is terminated to shift the operation to normal cooling operation. Performing the dielectric heating operation for a desired period even when the rapid cooling operation is performed, as described above, enables the food to be brought into a preferable frozen state.

[1-12. Safety Control Using Door Switch]

As described above, refrigerator 1 according to the present exemplary embodiment is provided with electromagnetic wave shield 26 surrounding freezing-thawing chamber 6 to prevent electromagnetic waves from leaking to the outside of refrigerator 1. Additionally, outer box 3 is made of a steel plate, and the steel plate itself has a function as an electromagnetic wave shield. Thus, leakage of an electromagnetic wave to the outside is prevented when door 29 is closed.

However, when door 29 is opened, the electromagnetic wave may leak from the opening. When a user puts his or her hand into the refrigerator through the opening, high frequency waves may affect the human body, and thus measures are required.

Thus, oscillation circuit 22 according to the present exemplary embodiment is stopped to stop power supply to oscillation electrode 24 when door opening-closing detector 55a (see FIG. 9) for detecting opening of door 29 detects that door 29 is opened. A refrigerator is generally provided with a plurality of doors. Under conditions where electromagnetic wave shield 26 sufficiently functions, external leakage of the electromagnetic wave larger than a predetermined value is prevented even when opening of a door of a storage chamber other than freezing-thawing chamber 6 is detected by door opening-closing detector 55b of refrigerating chamber 5, door opening-closing detector 55c of ice-making chamber 7, door opening-closing detector 55d of freezing chamber 8, or door opening-closing detector 55e of vegetable chamber 9. This allows oscillation circuit 22 to continue its operation without stopping.

This shall not apply to freezing-thawing chamber 6 that is not sufficiently surrounded by electromagnetic wave shield 26 due to a design problem.

For example, when electromagnetic wave shield 26 cannot be provided in a top surface portion of freezing-thawing chamber 6, oscillation circuit 22 is stopped when a door of a storage chamber (refrigerating chamber 5 in the layout of FIG. 1) above freezing-thawing chamber 6 is opened. When electromagnetic wave shield 26 cannot be provided in a bottom surface portion of freezing-thawing chamber 6, oscillation circuit 22 is stopped when a door of a storage chamber (freezing chamber 8 or vegetable chamber 9 in the layout of FIG. 1) below freezing-thawing chamber 6 is opened. When electromagnetic wave shield 26 cannot be provided in a side surface portion of freezing-thawing chamber 6, oscillation circuit 22 is stopped when a door of a storage chamber (ice-making chamber 7 in the layout of FIG. 1) laterally to freezing-thawing chamber 6 is opened. As described above, leakage of the electromagnetic wave can be prevented by stopping oscillation circuit 22 when a door of a storage chamber disposed in a direction in which electromagnetic wave shield 26 cannot be provided is opened.

Means for stopping oscillation circuit 22 includes the following means.

Figure 18A:
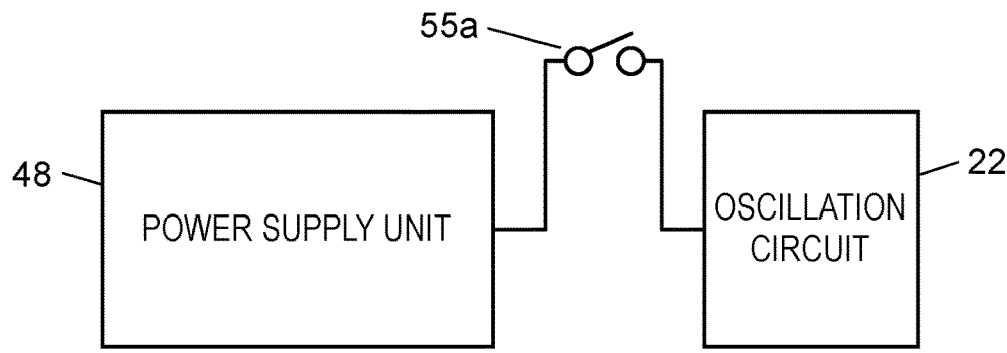
FIG. 18A is a diagram illustrating an example of a high frequency cut-off circuit when a door of the refrigerator according to the first exemplary embodiment is opened.

FIG. 18A illustrates means for interrupting power supply from power supply unit 48 to oscillation circuit 22 using door opening-closing detector 55a. Door opening-closing detector 55a is a switch mechanism that is conducted when door 29 is closed and is interrupted when door 29 is opened. When the switch is interrupted, the power supply to oscillation circuit 22 is interrupted, whereby operation of oscillation circuit 22 is reliably stopped.

Figure 18B:
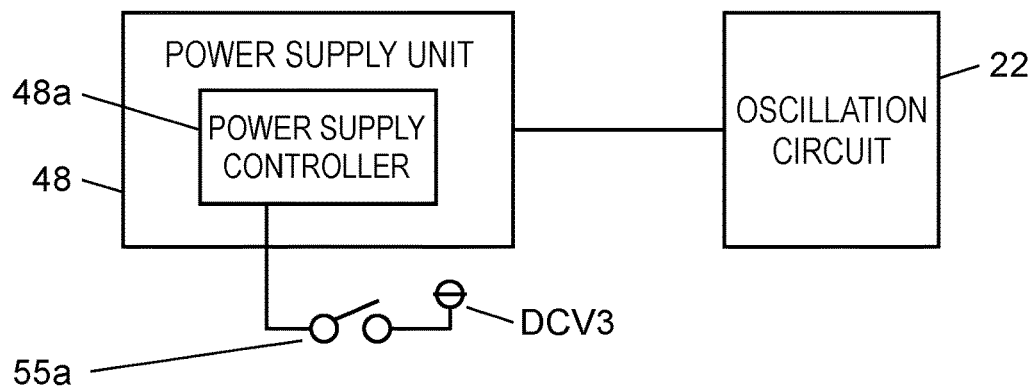
FIG. 18B is a diagram illustrating another example of the high frequency cut-off circuit when the door of the refrigerator according to the first exemplary embodiment is opened.

FIG. 18B illustrates means for stopping operation of power supply controller 48a, which controls power supply unit 48, using door opening-closing detector 55a. Door opening-closing detector 55a is a switch mechanism similar to that in FIG. 18A. When door 29 is opened, power supply to power supply controller 48a is stopped. Thus, power supply from power supply unit 48 to oscillation circuit 22 is also stopped, thereby stopping the operation of oscillation circuit 22. Although in the example illustrated in FIG. 18B, the operation of oscillation circuit 22 is stopped by interrupting power supply to a circuit in power supply controller 48a, means for stopping the operation by causing an overcurrent protection circuit in power supply controller 48a to recognize an overcurrent state, or means for stopping the operation by causing power supply unit 48 to recognize an overload state, may be used.

Figure 18C:
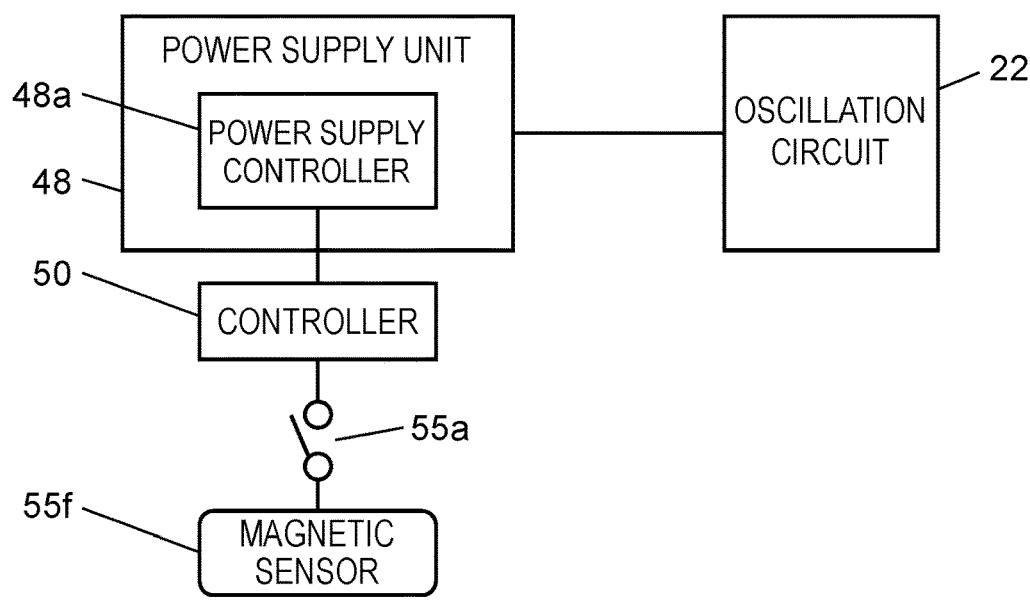
FIG. 18C is a diagram illustrating still another example of the high frequency cut-off circuit when the door of the refrigerator according to the first exemplary embodiment is opened.

FIG. 18C illustrates a configuration in which an open-close state of door 29 is determined by not only door opening-closing detector 55a but also magnetic sensor 55f. Magnetic sensor 55f outputs an open-close signal of door 29 to controller 50. Upon receiving a signal from magnetic sensor 55f, controller 50 outputs an operation propriety signal to power supply controller 48a. Door opening-closing detector 55a is further inserted between magnetic sensor 55f and controller 50 that are conducted when door 29 is closed, and are interrupted when door 29 is opened. Thus, when door 29 is opened, output of a signal from magnetic sensor 55f is stopped. As a result, operation of power supply unit 48 is stopped.

The configuration for conduction or interruption of power supply or a control signal described above is fabricated by hardware, thereby achieving high resistance to high frequency noise or external noise. Thus, a malfunction is less likely to occur.

FIGS. 18B and 18C each illustrate door opening-closing detector 55a configured as a switch mechanism that is conducted when door 29 is closed and is interrupted when door 29 is opened. Alternatively, means for using a mechanism that is interrupted when door 29 is closed and conducted when door 29 is opened may be used. At this time, logic of H (High) and L (Low) for stopping power supply controller 48a needs to be reversed.

As described above, freezing-thawing chamber 6 of the refrigerator of the first exemplary embodiment enables not only food to be frozen and stored in a desired state, but also a frozen product in a desired state to be thawed to a desired state in a short time. Additionally, using a dielectric heating mechanism including a semiconductor element enables a refrigerator having a function of thawing to be downsized.

Although the refrigerator of the first exemplary embodiment is described in which freezing-thawing chamber 6 has a function of freezing and a function of thawing, freezing-thawing chamber 6 may be configured as a thawing chamber having only the function of thawing.

As described above, the refrigerator of the present disclosure is configured to thaw a preserved product accommodated in a storage chamber by generating a high-frequency electric field between the oscillation electrode and the counter electrode. This high-frequency electric field is made uniform in a thawing space of the freezing-thawing chamber, and desired dielectric heating can be performed in thawing treatment and freezing treatment on the preserved product held in the thawing space. Thus, according to the present disclosure, a preserved product accommodated in a storage chamber can be frozen, stored, and thawed in a desired state. This fabricates a refrigerator having highly reliable functions of cooling, storage, and thawing. Additionally, a shield prevents leakage of an electromagnetic wave, so that the refrigerator can be improved in safety by avoiding having an adverse effect of high frequency waves on a preserved food in another storage chamber and a user who handles the refrigerator.

[2-1. Advantageous Effects, Etc.]

As described above, a refrigerator according to one aspect of the present disclosure includes the following: at least one storage chamber having a space capable of storing a preserved product; a first power supply part that rectifies an alternating current from a commercial AC power supply and converts the alternating current into a direct current; a first ground part that serves as a reference potential of the first power supply part; a second power supply part and a third power supply part that each step down an output voltage of the first power supply part and output the stepped-down output voltage; a second ground part that serves as a reference potential of the second power supply part; a third ground part that serves as a reference potential of the third power supply part; an oscillator that is supplied with power from the second power supply part and forms high frequency power; an oscillation electrode that receives the high frequency power formed by the oscillator and generates an electric field in the storage chamber; a counter electrode provided to face the oscillation electrode; a matching unit that matches an output impedance of the oscillator with an impedance of devices including an oscillation electrode and a counter electrode that are connected to the oscillator; a controller that is supplied with power from the third power supply part and controls a high-frequency electric field to be applied between the oscillation electrode and the counter electrode; and a shield that prevents electromagnetic wave leakage due to generation of a high-frequency wave.

This produces an excellent effect of enabling not only a preserved product such as food to be frozen and stored in a desired state, but also a frozen product in a desired state to be thawed to a desired state in a short time. Additionally, using a dielectric heating mechanism including a semiconductor element enables a refrigerator having a function of thawing to be downsized. Additionally, reliability and safety can be improved by avoiding having an adverse effect of high frequency waves on a preserved food in another storage chamber and a user who handles the refrigerator.

The second power supply part, the third power supply part, or both of the second and third power supply parts may be composed of a switching power supply.

The first power supply part and the second power supply part may be configured to be insulated from each other.

The first power supply part, the second power supply part, and the third power supply part may all be insulated from one another.

The counter electrode and the shield may be configured not to be electrically connected near the storage chamber.

The shield may be configured to be connected to the first ground part.

Alternatively, the shield may be connected to the third ground part.

Although the present disclosure has been described in the exemplary embodiment in details to some extent, the disclosed content of the exemplary embodiment should be changed in the details of the configuration, and replacement, combination, and change of the order of the elements in the exemplary embodiment can be achieved without departing from the scope and spirit of the claims of the present disclosure.

INDUSTRIAL APPLICABILITY

The refrigerator of the present disclosure enables not only treatment in which a preserved product is frozen, stored, and thawed in a desired state and achieving highly reliable cooling and storage functions while being downsized, but also enhancing safety by sufficiently suppressing an adverse effect of high frequency waves on a preserved food in another storage chamber and a user who handles the refrigerator, by using the shield. This allows a refrigerator to have high market values such as an added value, reliability, and safety, so that the present disclosure can be suitably applied to various refrigerators.

REFERENCE MARKS IN THE DRAWINGS

1: refrigerator
2: heat-insulating box
3: outer box
4: inner box
5: refrigerating chamber
6: freezing-thawing chamber (storage chamber)
7: ice-making chamber
8: freezing chamber
9: vegetable chamber
10: machine chamber
11: cooling chamber
12: air passage
12a: damper
13: cooler
14: cooling fan
15: defrosting heater
16: drain pan
17: drain tube
18: evaporating pan
19: compressor
20: cold air introduction hole
21: cross rail
22: oscillation circuit (oscillator)
22a: oscillation source
22b: first amplifier circuit
22c: second amplifier circuit
23: matching circuit (matching unit)
24: oscillation electrode
24a, 24b, 24c: anode terminal
25: counter electrode
25a, 25b, 25c: cathode terminal
26: electromagnetic wave shield (shield)
26a: top-side electromagnetic wave shield
26b: back-side electromagnetic wave shield
26c: bottom-side electromagnetic wave shield
26d: door-side electromagnetic wave shield
29: door
30: electrode holding region
31: housing case
32a, 32b, 32c: inner surface member
36: gasket
40: heat insulator
41: electrode hole (oscillation electrode hole)
42: electrode hole (counter electrode hole)
47: operation unit
48: power supply unit
48a: power supply controller
49: temperature sensor
50: controller
51: incident-reflected wave detector
52: electrode holding board
53a: high-frequency heating module
54: strut
55a, 55b, 55c, 55d, 55e: door opening-closing detector
55f: magnetic sensor DCV0: first power supply part
GND0: first ground part
DCV1, DCV2: second power supply part
GND1: second ground part
DCV3: third power supply part
GND2: third ground part

The invention claimed is:

1. A refrigerator comprising:
a storage chamber having a space to store a preserved product;
a power supply unit;
an oscillator that is supplied with power from the power supply unit and forms high frequency power;
an oscillation electrode and a counter electrode disposed facing each other and connected to the oscillator, the oscillation electrode and the counter electrode receiving the high frequency power from the oscillator to generate a high-frequency electric field in the storage chamber;
a matching circuit that matches an output impedance of the oscillator to a load impedance of a device including the oscillation electrode and the counter electrode;
a controller configured to control application of the high-frequency electric field between the oscillation electrode and the counter electrode; and
a shield that prevents leakage of an electromagnetic wave due to generation of the high frequency power, wherein
the power supply unit includes
a first power supply part that rectifies an alternating current from a commercial alternating-current power supply and converts the alternating current into a direct current,
a first ground part having a reference potential of the first power supply part,
a second power supply part and a third power supply part that step down an output voltage of the first power supply part and output the stepped-down output voltage,
a second ground part having a reference potential of the second power supply part, and
a third ground part having a reference potential of the third power supply part,
wherein the oscillator is supplied with power from the second power supply part,
the controller is supplied with power from the third power supply part,
the shield is not electrically connected to the counter electrode, or if not insulated, is connected at a location separated by a predetermined distance from the counter electrode, and
the shield is not connected to any of the first ground part, second ground part, or third ground part.

2. The refrigerator according to claim 1, wherein at least one of the second power supply part and the third power supply part is a switching power supply.

3. The refrigerator according to claim 1, wherein the first power supply part and the second power supply part are insulated from each other.

4. The refrigerator according to claim 1, wherein all of the first power supply part, the second power supply part, and the third power supply part are insulated from one another.

* * * * *